United States Patent
Oshima et al.

(10) Patent No.: US 8,525,712 B2
(45) Date of Patent: Sep. 3, 2013

(54) SEMICONDUCTOR INTEGRATED CIRCUIT AND METHOD OF OPERATING THE SAME

(75) Inventors: Takashi Oshima, Moriya (JP); Tatsuji Matsuura, Kanagawa (JP); Naoki Yada, Kanagawa (JP); Takahiro Miki, Kanagawa (JP); Akihiro Kitagawa, Kanagawa (JP); Tetsuo Matsui, Kanagawa (JP); Kunihiko Usui, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 97 days.

(21) Appl. No.: 13/195,144

(22) Filed: Aug. 1, 2011

(65) Prior Publication Data

US 2012/0038498 A1    Feb. 16, 2012

(30) Foreign Application Priority Data

Aug. 16, 2010    (JP) .................................. 2010-181678

(51) Int. Cl.
*H03M 1/10*    (2006.01)
(52) U.S. Cl.
USPC .......................................................... 341/118
(58) Field of Classification Search
None
See application file for complete search history.

(56) References Cited

U.S. PATENT DOCUMENTS

| | | | |
|---|---|---|---|
| 5,486,832 A | 1/1996 | Hulderman | |
| 7,830,159 B1* | 11/2010 | Lee | ................................ 324/679 |
| 7,843,369 B2 | 11/2010 | Takahashi et al. | |
| 7,898,465 B2 | 3/2011 | Yamano et al. | |
| 2008/0231490 A1* | 9/2008 | Onoda | .......................... 341/155 |
| 2009/0131010 A1 | 5/2009 | Oshima et al. | |

FOREIGN PATENT DOCUMENTS

| | | |
|---|---|---|
| JP | 2008-241702 A | 10/2008 |
| JP | 2009-130444 A | 6/2009 |
| JP | 2009159415 A | 7/2009 |

OTHER PUBLICATIONS

Oshima, T.. 23-mW 50-MS/s 10-bit Pipeline A/D Converter with Nonlinear LMS Foreground Calibration, IEEE International Symposium on Circuits and Systems, 2009. ISCAS 2009, May 24-27, 2009, pp.: 960-963.*

* cited by examiner

*Primary Examiner* — Howard Williams
(74) *Attorney, Agent, or Firm* — Mattingly & Malur, PC

(57) ABSTRACT

To improve resolution of a built-in A/D converter by reducing the area occupied by a chip of the built-in A/D converter in a semiconductor integrated circuit that is mounted in an on-vehicle millimeter wave radar device and which incorporates an A/D converter and an MPU. In the semiconductor integrated circuit, a plurality of reception signals of the radar device is A/D-converted by a single digital correction type A/D converter. The digital correction type A/D converter of the single A/D converter is a foreground digital correction type A/D converter that sequentially A/D-converts the reception signals output from a multiplexer of a receiving interface. The single A/D converter includes a pipeline type A/D converter having a plurality of cascade-coupled converters. The semiconductor integrated circuit comprises a correction signal generating unit, a digital correction D/A converter, and a digital correction unit for digital correction.

10 Claims, 19 Drawing Sheets

SEMICONDUCTOR INTEGRATED CIRCUIT AND METHOD OF OPERATING THE SAME

CROSS-REFERENCE TO RELATED APPLICATION

The disclosure of Japanese Patent Application No. 2010-181678 filed on Aug. 16, 2010 including the specification, drawings and abstract is incorporated herein by reference in its entirety.

BACKGROUND

The present invention relates to a semiconductor integrated circuit that can be mounted in an on-vehicle millimeter wave radar device and which incorporates a microprocessor unit (MPU) and an A/D converter, and a method of operating the same and, more particularly, to technology effective when applied to improve resolution of a built-in A/D converter by reducing the area occupied by a chip of the built-in A/D converter.

In recent years, an on-vehicle millimeter wave radar has attracted attention of each automobile equipment maker as a key part in an adaptive cruise control (ACC) system. The frequency used in an on-vehicle millimeter wave radar is 76 GHz.

Patent Document 1 (Japanese Patent Laid-Open No. 2008-241702), to be described below, describes an on-vehicle radar device comprising a transmission unit to radiate a millimeter wave transmission signal as an electromagnetic wave from a transmitting antenna, a reception unit including a plurality of receiving array antennas to receive a reception signal as a reflected radio wave from a target object, and a target object detection unit to calculate the distance, relative speed, and orientation information of the object from the reception signal of the reception unit. In the reception unit, a plurality of reception signals of the receiving array antennas is amplified by a plurality of RF amplifiers, respectively, and then, down-converted into a plurality of beat signals by a plurality of reception mixers. In the reception unit, the beat signals are further supplied to a plurality of analog input terminals of a plurality of A/D converters via a plurality of low pass filters and a plurality of digital outputs of the A/D converters is accumulated in a buffer unit and output to the target object detection unit.

Patent Document 2 (U.S. Pat. No. 5,486,832 Specification), to be described below, describes a millimeter wave radar system comprising a transmitter including a reference oscillator, a waveform controller, a gun transmitter, etc., and an RF sensor including a plurality of receiving antennas, a plurality of reception mixers, a plurality of low pass filters, and a multiplexer. The multi-input terminal of the multiplexer of the RF sensor is coupled to a plurality of output terminals of the reception mixers via the low pass filters and a plurality of selection control terminals of the multiplexer is controlled by a beam selector and a video signal generated from a radar signal received by the receiving antennas is output sequentially from a single-output terminal of the multiplexer. The output signal of the multiplexer is supplied to a radar signal processor including an amplifier, a video blanking circuit, a single A/D converter, and a range/Doppler processor. The output signal of the range/Doppler processor is supplied to a detection/tracking processor the output signal of which is supplied to a display device.

On the other hand, although not related to the on-vehicle millimeter wave radar directly, Patent Document 3 (Japanese Patent Laid-Open No. 2009-130444) and Patent Document 4 (Japanese Patent Laid-Open No. 2009-159415), to be described below, describe a digital correction type A/D converter capable of high resolution.

The A/D converter described in Patent Document 3 is called a background digital correction type A/D converter and comprises a main A/D conversion unit to execute a high-speed A/D conversion operation with low precision, a reference A/D conversion unit to execute high-resolution A/D conversion at low speed, and a digital correction unit to generate a final digital output signal from the digital signal of the main A/D conversion unit and the digital signal of the reference A/D conversion unit.

The A/D converter described in Patent Document 4 is called a foreground digital correction type A/D converter and comprises a main A/D conversion unit, a reference D/A converter, a switch, a foreground calibration unit, and a digital output generation unit. During the period of calibration operation, the calibration digital signal is converted into a calibration analog signal by the reference D/A converter and the calibration analog signal is supplied to the input of the main A/D conversion unit via the switch. The digital signal of the main A/D conversion unit is supplied to the foreground calibration unit and the digital output generation unit, the calibration digital signal and the final digital output signal of the digital output generation unit are supplied to the foreground calibration unit, and the output of the foreground calibration unit is supplied to the digital output generation unit. As a result of that, the digital output generation unit is controlled by the output of the foreground calibration unit so that the calibration digital signal supplied to the foreground calibration unit and the final digital output signal of the digital output generation unit agree with each other.

SUMMARY

Prior to the present invention, the inventors of the present invention have engaged in research/development of a system LSI semiconductor integrated circuit mounted in an on-vehicle millimeter wave radar device mounted in an automobile. In particular, it is required for the system LSI to incorporate not only a microprocessor unit (MPU) for digital calculation but also an A/D converter to which a reception output signal generated from a plurality of reception mixers coupled to a plurality of receiving antennas mounted in an on-vehicle millimeter wave radar device is supplied. Further, it is required for the on-vehicle millimeter wave radar device mounting the system LSI to calculate the distance, relative speed, and orientation information of an object with high precision, and therefore, the A/D converter is required to have high resolution.

Prior to the present invention, the inventors of the present invention have examined a built-in A/D converter of a system LSI mounted in an on-vehicle millimeter wave radar device.

The built-in A/D converter of the system LSI examined by the inventors of the present invention prior to the present invention is a system in which a plurality of reception output signals generated from a plurality of reception mixers is A/D-converted by a plurality of A/D converters as described in Patent Document 1 described above. In this system, the reception output signals are A/D-converted in parallel by the A/D converters, and therefore, a low-speed operation is permitted for each A/D converter of the A/D converters. Consequently, the employment of the background digital correction type A/D converter with high resolution described in Patent Document 3 has been examined as a plurality of A/D converters in the parallel operation to achieve high precision of an on-vehicle millimeter wave radar device. However, the area occupied by a semiconductor chip of a reference A/D conversion unit executing A/D conversion at low speed and with high resolution in the background digital correction type A/D converter is comparatively large, and therefore, such a problem that the total area occupied by the semiconductor chip of the built-in A/D converter becomes extremely large has been made clear by the examination of the inventors of the present invention prior to the present invention. Further, such a problem that the power consumption of the built-in A/D converter is large because the A/D converters operate in parallel has been made clear by the examination of the inventors of the present invention prior to the present invention.

The present invention has been made as a result of the examination by the inventors of the present invention etc. prior to the present invention as described above.

Consequently, the present invention has been made in view of the above circumstances and further improves resolution of a built-in A/D converter by reducing the area occupied by a chip of the built-in A/D converter in a semiconductor integrated circuit that is mounted in an on-vehicle millimeter wave radar device and which incorporates a microcomputer processor unit (MPU) and an A/D converter.

The other purposes and the new feature of the present invention will become clear from the description of the present specification and the accompanying drawings.

The following explains briefly a typical invention among the inventions disclosed in the present application.

That is, in a semiconductor integrated circuit according to a typical embodiment of the present invention, a plurality of reception output signals generated from a plurality of reception mixers mounted in a millimeter wave radar device is A/D-converted by a single A/D converter. Further, the single A/D converter includes a digital correction type A/D converter.

Consequently, according to a system in a typical embodiment of the present invention, the area occupied by a chip of a built-in A/D converter is reduced and further, it is made possible to improve resolution of the built-in A/D converter.

Further, according to a preferred embodiment of the present invention, as the single A/D converter having high-speed performance required to sequentially A/D-convert the reception output signals generated from the reception mixers of the millimeter wave radar device, a foreground digital correction type A/D converter that requires a shorter time for the digital correction processing compared to that required by a background digital correction type A/D converter is used. Furthermore, in the reference D/A converter of the foreground digital correction type A/D converter, the area occupied by the chip is smaller compared to that in the reference A/D converter at low speed and with high resolution of the background digital correction type A/D converter. As a result of that, according to the preferred embodiment of the present invention, it is made possible to improve resolution of the built-in A/D converter by reducing the area occupied by the chip of the single built-in A/D converter.

The following explains briefly the effect acquired by the typical invention among the inventions disclosed in the present application.

That is, according to the present invention, it is possible to improve resolution of a built-in A/D converter by reducing the area occupied by a chip of the built-in A/D converter in a semiconductor integrated circuit that is mounted in an on-vehicle millimeter wave radar device and which incorporates a microprocessor unit (MPU) and an A/D converter.

DETAILED DESCRIPTION

1. Outline of Embodiments

Figure 1:
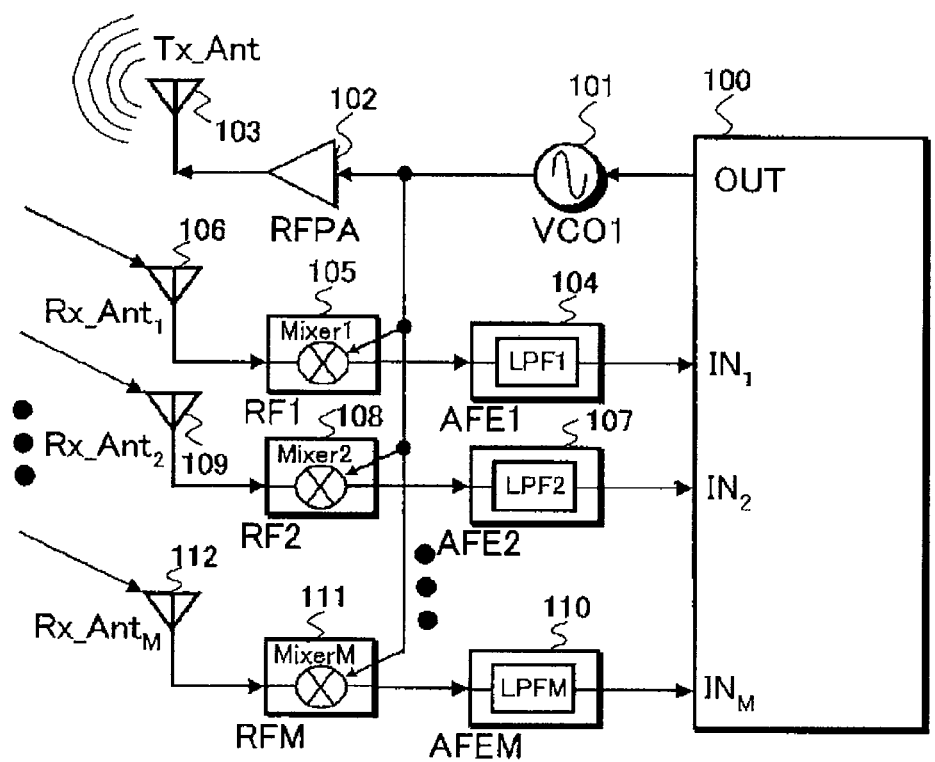
FIG. 1 is a diagram showing a configuration of an on-vehicle millimeter wave radar device according to a first embodiment of the present invention, in which a semiconductor integrated circuit 100 as a system LSI incorporating a microprocessor unit and an A/D converter is mounted.

First, the outline of a typical embodiment of the inventions disclosed in the present application is explained. A reference symbol with brackets in the drawings referred to in the explanation of the outline of the typical embodiment only illustrates that which is included in the concept of the component to which it is attached.

[1]

The typical embodiment of the present invention is a semiconductor integrated circuit that can be mounted in a millimeter wave radar device.

The semiconductor integrated circuit comprises a single A/D converter (2) to A/D-convert a plurality of reception signals generated from a plurality of reception mixers (105, 108, ..., 111) of the millimeter wave radar device and a microprocessor unit (7) that responds to an output digital signal of the A/D converter.

Figure 2:
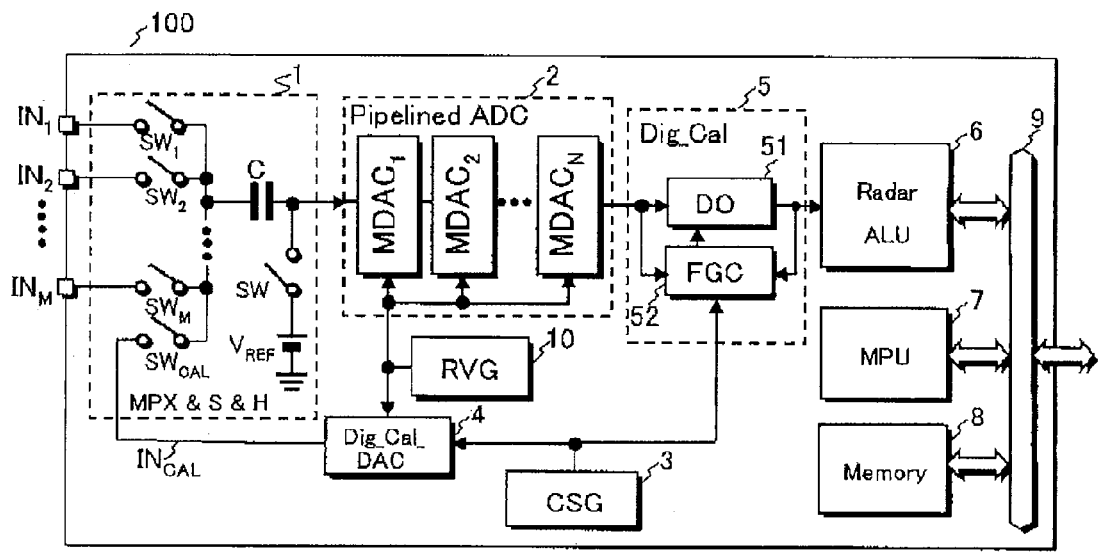
FIG. 2 is a diagram showing a configuration of the semiconductor integrated circuit 100 as a system LSI according to a second embodiment of the present invention which is mounted in the on-vehicle millimeter wave radar device according to the first embodiment of the present invention shown in FIG. 1 and which incorporates a microprocessor unit and an A/D converter.

The single A/D converter is characterized by including a digital correction type A/D converter (see FIG. 2).

According to the embodiment, it is possible to improve resolution of a built-in A/D converter by reducing the area occupied by a chip of the built-in A/D converter.

A semiconductor integrated circuit according to a preferred embodiment further comprises a receiving interface (1) including a multiplexer having a plurality of input terminals ($IN_1$, $IN_2$, ... $IN_M$) to which the reception signals can be supplied as a multi-input terminal.

The digital correction type A/D converter as the single A/D converter is characterized by being a foreground digital correction type A/D converter (2, 3, 4, 5) that sequentially A/D-converts the reception signals output from an output terminal of the multiplexer of the receiving interface (1) (see FIG. 2).

In another preferred embodiment, the single A/D converter is characterized by including a pipeline type A/D converter (2) having a plurality of cascade-coupled converters ($MDAC_1$, $MDAC_2$, ..., $MDAC_N$) (see FIG. 2).

A semiconductor integrated circuit according to still another preferred embodiment further comprises a correction signal generating unit (3), a digital correction D/A converter (4), and a digital correction unit (5) to constitute the foreground digital correction type A/D converter.

During the period of calibration operation of the foreground digital correction type A/D converter, a calibration digital signal generated from the correction signal generating unit (3) is supplied to an input terminal of the digital correction D/A converter (4) and a calibration analog signal ($IN_{CAL}$) generated from an output terminal of the digital correction D/A converter is supplied to an input terminal of the single A/D converter (2) via the output terminal of the multiplexer.

The embodiment is characterized in that a digital calibration output signal generated from an output terminal of the single A/D converter (2) and the calibration digital signal generated from the correction signal generating unit (3) are supplied to the digital correction unit (5) during the calibration operation, and thereby, a foreground digital correction output signal is generated from an output terminal of the digital correction unit (5) (see FIG. 2).

In a more preferred embodiment, during the normal operation of the foreground digital correction type A/D converter, the reception signals output from the output terminal of the multiplexer are supplied sequentially to the input terminal of the single A/D converter (2).

The embodiment is characterized in that a digital normal output signal generated sequentially from the output terminal of the single A/D converter (2) is supplied to the digital correction unit (5) during the normal operation, and thereby, a normal digital correction output signal is generated from the output terminal of the digital correction unit (5) (see FIG. 2).

In another more preferred embodiment, the receiving interface (1) is characterized by further including one capacitor (C) coupled between the output terminal of the multiplexer and the input terminal of the single A/D converter (2) (see FIG. 2).

Figure 7:
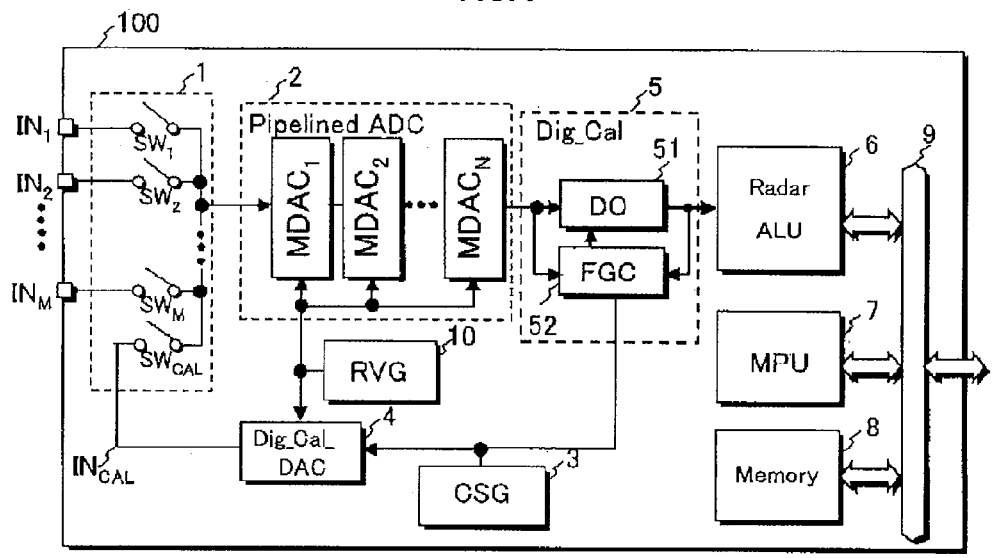
FIG. 7 is a diagram showing a configuration of the semiconductor integrated circuit 100 as a system LSI according to a third embodiment of the present invention which is mounted in the on-vehicle millimeter wave radar device according to the first embodiment of the present invention shown in FIG. 1 and which incorporates a microprocessor unit and an A/D converter.

In still another more preferred embodiment, the output terminal of the multiplexer of the receiving interface (1) and the input terminal of the single A/D converter (2) are coupled in a direct-current manner (see FIG. 7).

The converter ($MDAC_1$) in the first stage of the cascade-coupled converters of the pipeline type A/D converter (2) includes an internal capacitor (2C) coupled to an input terminal of an internal sub A/D converter (SADC), an output terminal of a sub D/A converter (SDAC), and an input terminal of an amplifier (X2).

Figure 8:
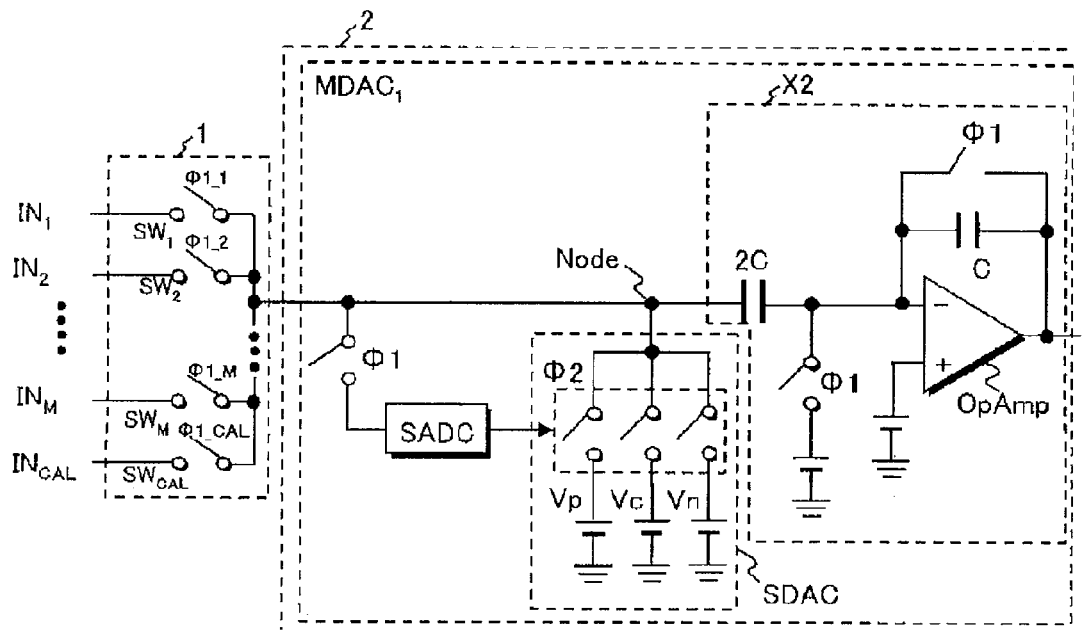
FIG. 8 is a diagram showing a configuration of a pipeline type A/D converter as a single A/D converter 2 which enables omission of a sample hold capacitor C and a sample hold switch SW in the receiving interface 1 of the semiconductor integrated circuit 100 according to the third embodiment of the present invention shown in FIG. 7.

An analog input voltage of the output terminal of the multiplexer is characterized by being capable of being sampled by the internal capacitor (2C) of the converter ($MDAC_1$) in the first stage (see FIG. 7, FIG. 8).

In another more preferred embodiment, the receiving interface (1) further includes a plurality of capacitor elements ($C_1$, $C_2$, ... $C_M$) coupled respectively between the multi-input terminal ($IN_1$, $IN_2$, ..., $IN_M$) of the multiplexer and the output terminal of the multiplexer.

Figure 10:
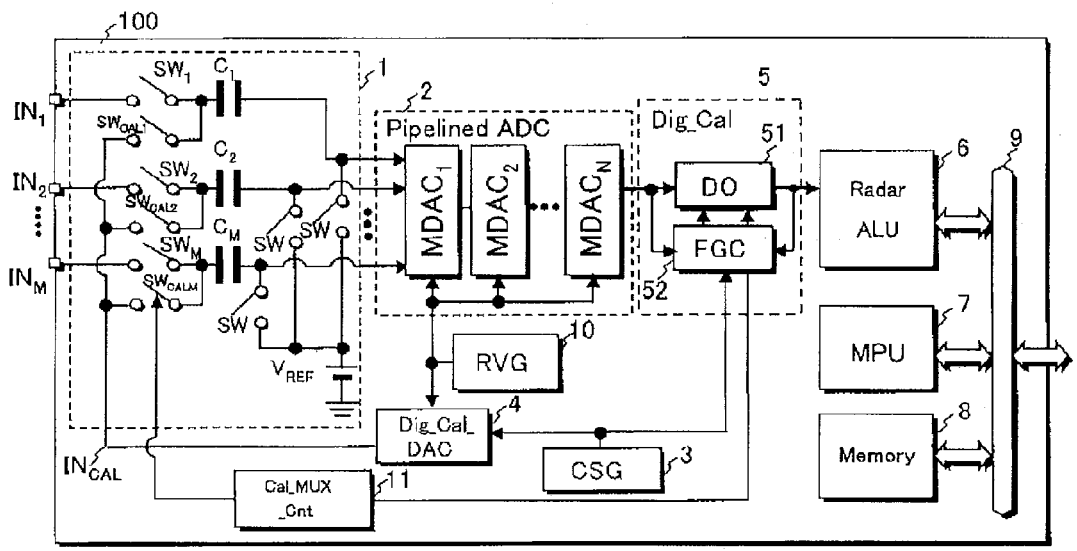
FIG. 10 is a diagram showing a configuration of the semiconductor integrated circuit 100 as a system LSI according to a fourth embodiment of the present invention which is mounted in the on-vehicle millimeter wave radar device according to the first embodiment of the present invention shown in FIG. 1 and which incorporates a microprocessor unit and an A/D converter.
Figure 13:
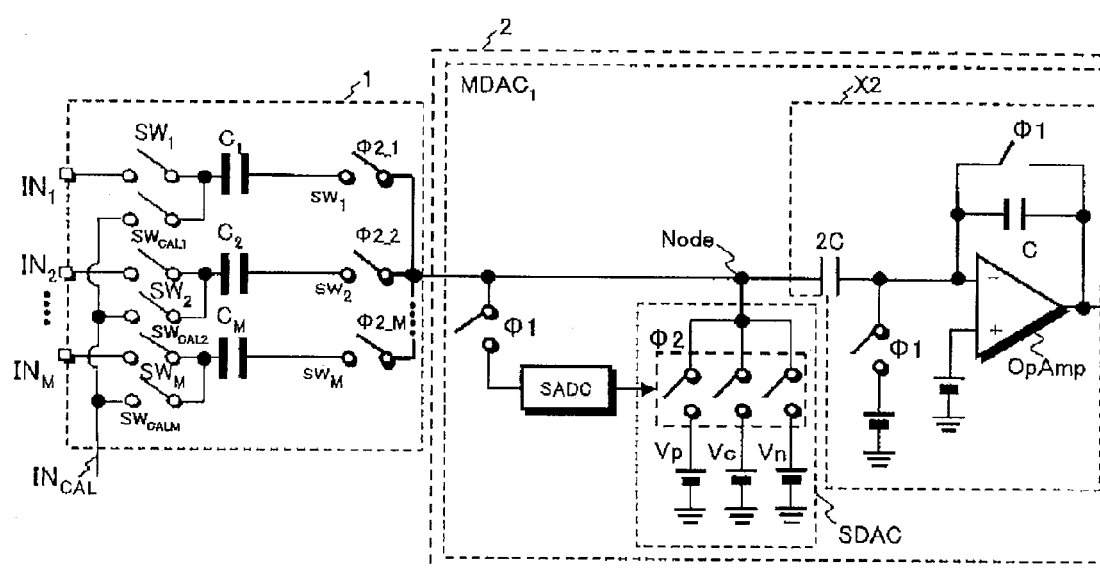
FIG. 13 is a diagram showing a specific configuration of a multiplication type D/A converter $MDAC_1$ in the first stage of a plurality of cascade-coupled multiplication type D/A converters constituting the receiving interface 1 and the single A/D converter 2 of the semiconductor integrated circuit 100 according to the fourth embodiment of the present invention shown in FIG. 10.

The receiving interface (1) further includes a plurality of calibration switches ($SW_{CAL\ 1}$, $SW_{CAL\ 2}$, ..., $SW_{CAL\ M}$) coupled respectively between the capacitor elements ($C_1$, $C_2$, ..., $C_M$) and the output terminal of the digital correction D/A converter (see FIG. 10, FIG. 13).

During the normal operation of the foreground digital correction type A/D converter, the reception signals generated from the reception mixers are sampled substantially at the same time by the capacitor elements ($C_1$, $C_2$, ..., $C_M$).

During the calibration operation of the foreground digital correction type A/D converter, the calibration switches ($SW_{CAL\ 1}$, $SW_{CAL\ 2}$, ..., $SW_{CAL\ M}$) are controlled sequentially into the ON state and the calibration analog signal ($IN_{CAL}$) generated from the output terminal of the digital correction D/A converter is supplied sequentially to the capacitor elements ($C_1$, $C_2$, ..., $C_M$).

The embodiment is characterized in that during the calibration operation, the digital correction unit (5) sequentially executes a digital calibration operation for a plurality of digital calibration output signals generated sequentially from the output terminal of the single A/D converter (2) in response to the calibration analog signal supplied sequentially to the capacitor elements.

Figure 17:
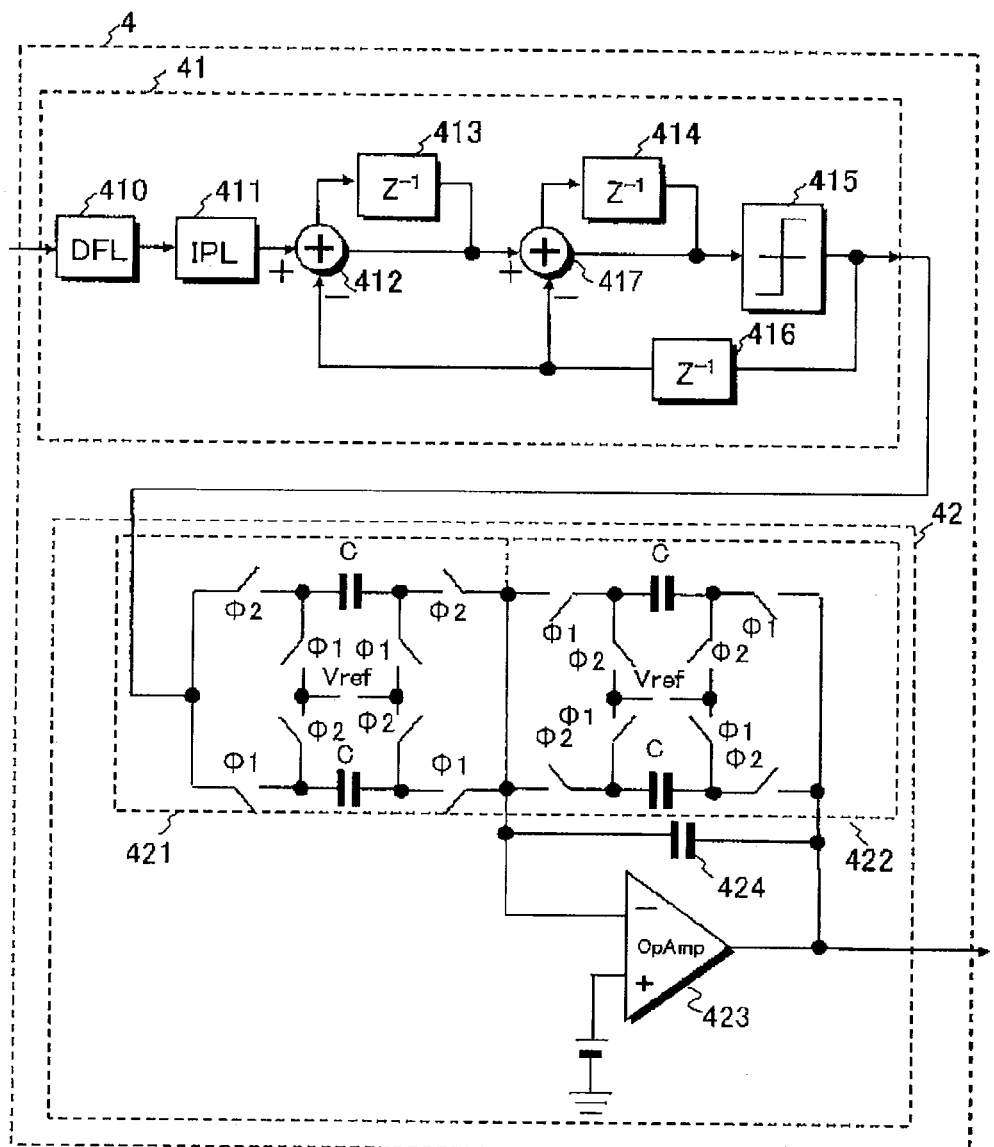
FIG. 17 is a diagram showing a configuration of $\Sigma\Delta$ type D/A converter as the digital correction D/A converter 4 used in the semiconductor integrated circuit 100 as the system LSI according to the second embodiment of the present invention shown in FIG. 2, the third embodiment of the present invention shown in FIG. 7, or the fourth embodiment of the present invention shown in FIG. 10.

In a specific embodiment, the digital correction D/A converter (4) is characterized by including a $\Sigma\Delta$ type D/A conversion unit (41) and a switched capacitor low pass filter (42) that are cascade-coupled (see FIG. 17).

Figure 18:
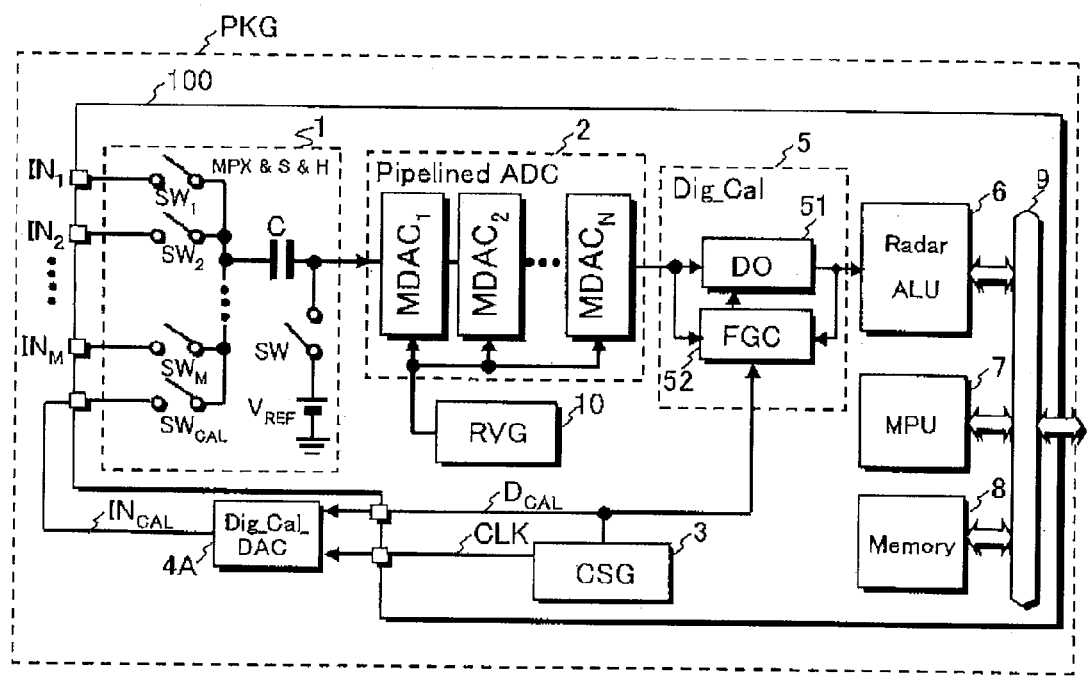
FIG. 18 is a diagram showing a configuration of a system-in-package according to a sixth embodiment of the present invention which is mounted in the on-vehicle millimeter wave radar device according to the first embodiment of the present invention shown in FIG. 1 and which incorporates a microprocessor unit and an A/D converter.
Figure 19:
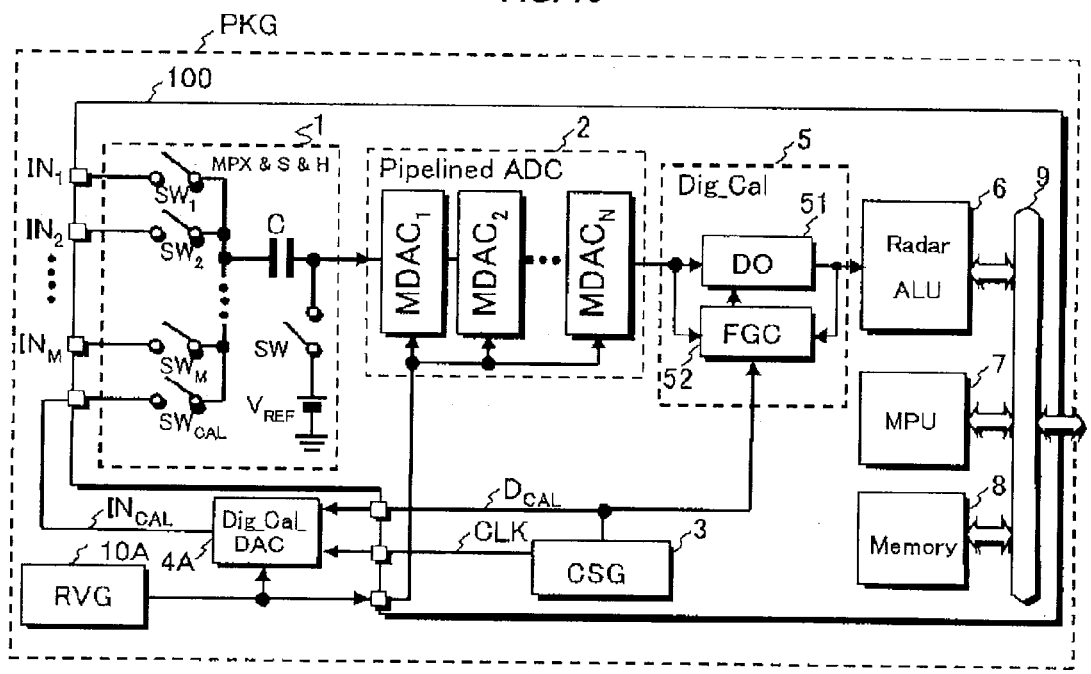
FIG. 19 is a diagram showing a configuration of a system-in-package according to a seventh embodiment of the present invention which is mounted in the on-vehicle millimeter wave radar device according to the first embodiment of the present invention shown in FIG. 1 and which incorporates a microprocessor unit and an A/D converter.

In another specific embodiment, a first semiconductor chip (100) comprising the single A/D converter (2) and the microprocessor unit (7) and a second semiconductor chip constituting the digital correction D/A converter (4A) are characterized by being incorporated in a sealing package (PKG) of the semiconductor integrated circuit configured in the form of a system-in-package (see FIG. 18, FIG. 19).

Figure 20:
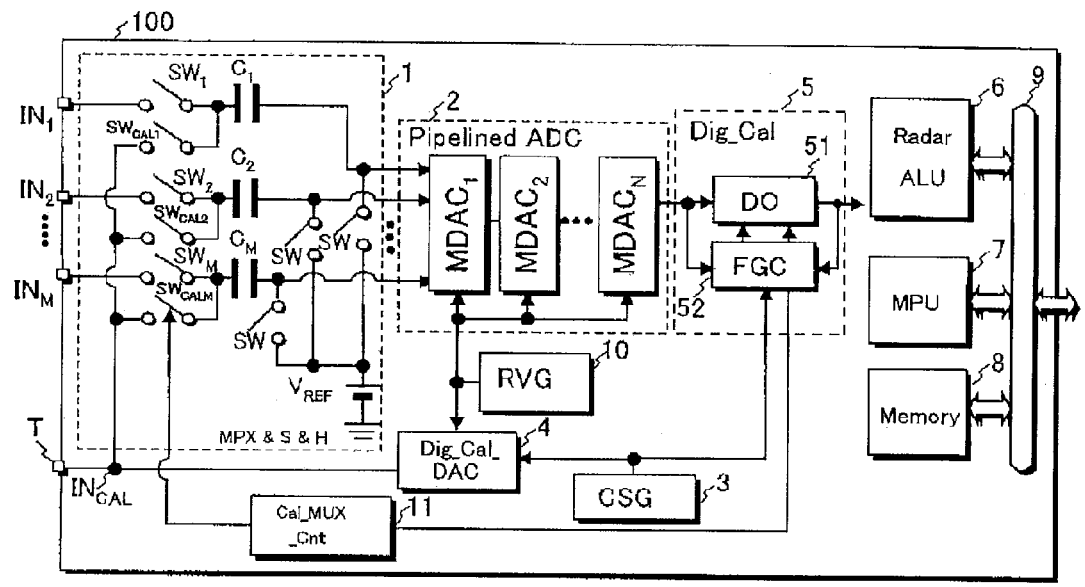
FIG. 20 is a diagram showing a configuration of the semiconductor integrated circuit 100 as a system LSI according to an eighth embodiment of the present invention which is mounted in the on-vehicle millimeter wave radar device according to the first embodiment of the present invention shown in FIG. 1 and which incorporates a microprocessor unit and an A/D converter.

In still another specific embodiment, the output terminal of the digital correction D/A converter and the calibration switches ($SW_{CAL\ 1}$, $SW_{CAL\ 2}$, ..., $W_{CAL\ M}$) are characterized by being electrically coupled to an external terminal (T) of the semiconductor integrated circuit (see FIG. 20).

A semiconductor integrated circuit according to another specific embodiment further comprises a divider (12) capable of executing a division operation of an operation clock signal ($f_{CLK}$).

During the normal operation of the foreground digital correction type A/D converter, the number of divisions (L) of the divider (12) is set to a small value and a normal operation output clock signal of the divider (12) the number of divisions of which is set to the small value is supplied to the single A/D converter (2) and the digital correction D/A converter (4).

Figure 21:
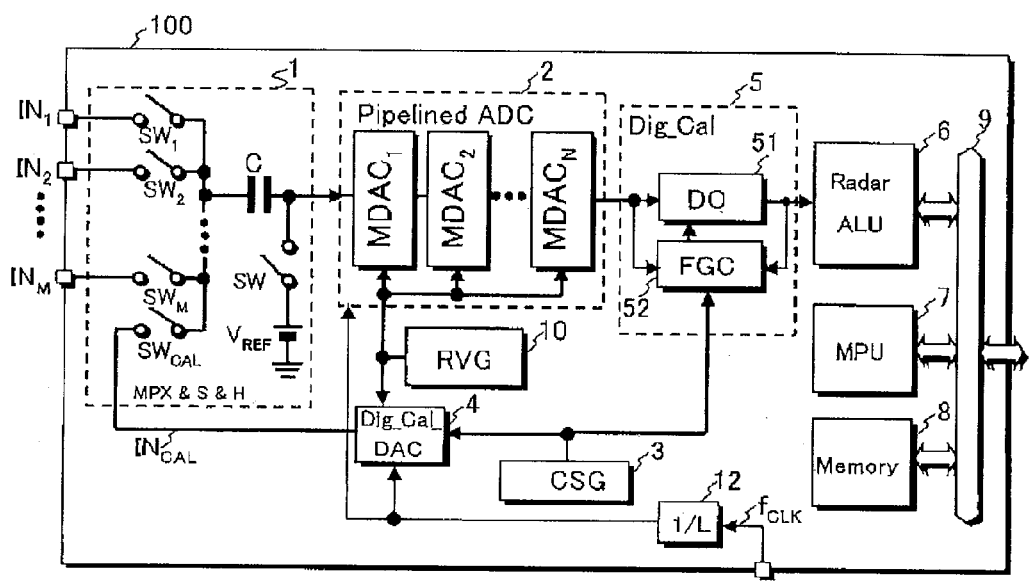
FIG. 21 is a diagram showing a configuration of the semiconductor integrated circuit 100 as a system LSI according to a ninth embodiment of the present invention which is mounted in the on-vehicle millimeter wave radar device according to the first embodiment of the present invention shown in FIG. 1 and which incorporates a microprocessor unit and an A/D converter.

The embodiment is characterized in that during the calibration operation of the foreground digital correction type A/D converter, the number of divisions (L) of the divider (12) is set to a value larger than the small value and a calibration operation output clock signal of the divider (12) the number of divisions of which is set to the large value is supplied to the single A/D converter (2) and the digital correction D/A converter (4) (see FIG. 21).

A semiconductor integrated circuit according to still another specific embodiment further comprises a divider (12) capable of executing a division operation of an operation clock signal ($f_{CLK}$).

Figure 22:
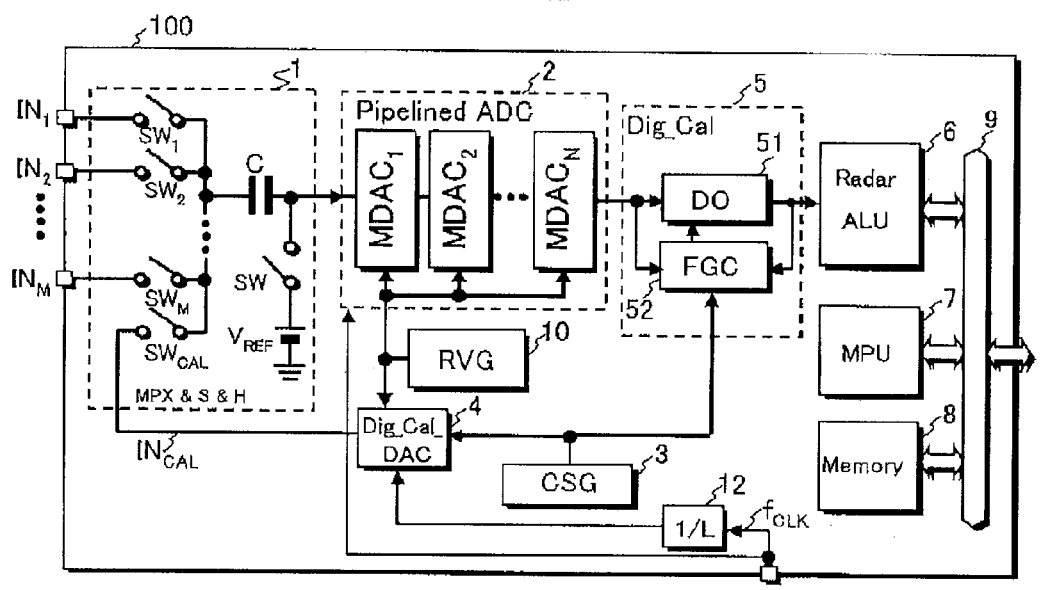
FIG. 22 is a diagram showing a configuration of the semiconductor integrated circuit 100 as a system LSI according to a tenth embodiment of the present invention which is mounted in the on-vehicle millimeter wave radar device according to the first embodiment of the present invention shown in FIG. 1 and which incorporates a microprocessor unit and an A/D converter.

The embodiment is characterized in that during the calibration operation of the foreground digital correction type A/D converter, the number of divisions (L) of the divider (12) is set to a value larger than the small value and a calibration operation output clock signal of the divider (12) the number of divisions of which is set to the large value and the operation clock signal ($f_{CLK}$) are supplied to the digital correction D/A converter (4) and the single A/D converter (2), respectively, (see FIG. 22).

Figure 23:
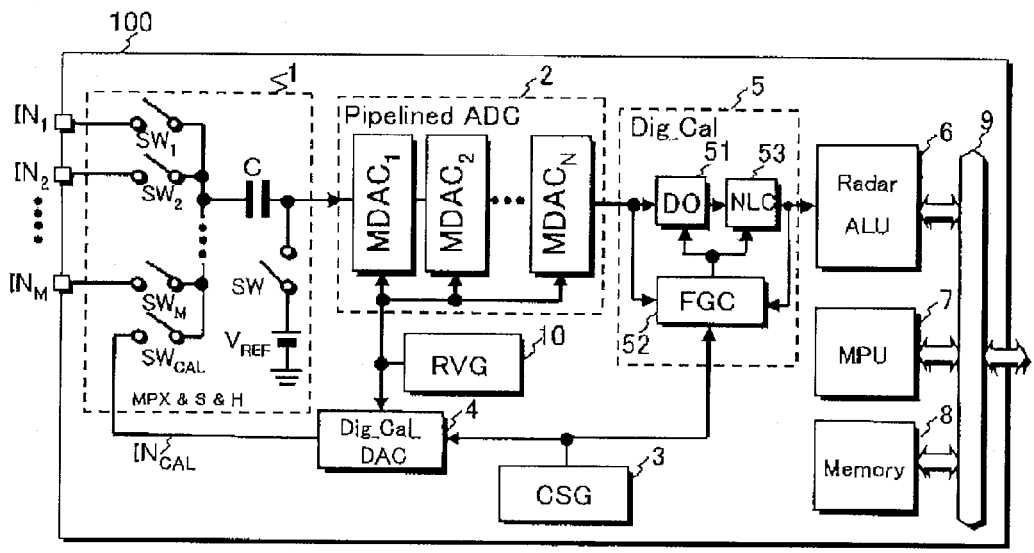
FIG. 23 is a diagram showing a configuration of the semiconductor integrated circuit 100 as a system LSI according to an eleventh embodiment of the present invention which is mounted in the on-vehicle millimeter wave radar device according to the first embodiment of the present invention shown in FIG. 1 and which incorporates a microprocessor unit and an A/D converter.

In a more specific embodiment, the digital correction unit (5) is characterized by including a nonlinear compensation unit (53) to compensate for the nonlinear characteristics of the digital correction D/A converter (4) (see FIG. 23).

In the most specific embodiment, in the receiving interface (1), a plurality of input terminals of a matrix switch (Matrix_SW) is coupled to the input terminals ($IN_1, IN_2, \ldots, IN_M$) and a plurality of capacitor elements ($C_1, C_2, \ldots, C_M$), to the capacitance values of which, predetermined weights ($1C, 2C, \ldots, 2^{M-1}C$) are added, is coupled to a plurality of output terminals of the matrix switch, and thereby, a capacitor D/A converter is configured by the capacitor elements to which the predetermined weights are added.

Figure 24:
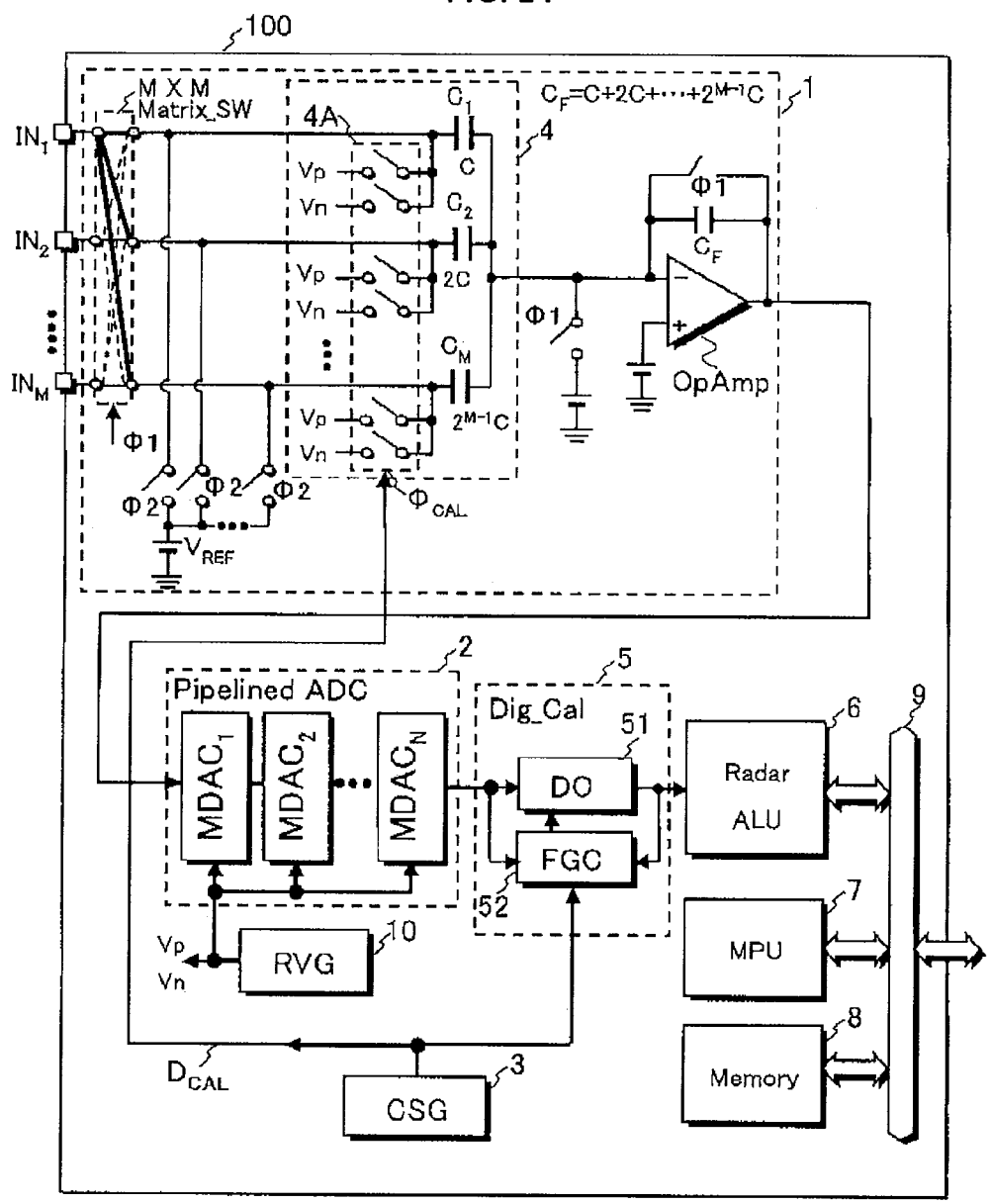
FIG. 24 is a diagram showing a configuration of the semiconductor integrated circuit 100 as a system LSI according to a twelfth embodiment of the present invention which is mounted in the on-vehicle millimeter wave radar device according to the first embodiment of the present invention shown in FIG. 1 and which incorporates a microprocessor unit and an A/D converter.

The embodiment is characterized in that the digital correction D/A converter (4) is configured by the capacitor D/A converter including the capacitor elements (see FIG. 24).

[2]

A typical embodiment from another viewpoint of the present invention is a method of operating a semiconductor integrated circuit that can be mounted in a millimeter wave radar device.

The semiconductor integrated circuit is a semiconductor integrated circuit described in any of the various embodiments of the present invention described in [1] described above.

The embodiment is characterized in that when turning on the power source of the semiconductor integrated circuit, prior to the execution of the first ($T_2$ to $T_3$) normal operation (A/D_Conv) of the foreground digital correction type A/D converter, the first ($T_0$ to $T_1$) calibration operation (Int_Cal) of the foreground digital correction type A/D converter is executed (see FIG. 27 to FIG. 31).

A preferred embodiment is characterized in that between the execution of the first ($T_2$ to $T_3$) normal operation (A/D_Conv) after turning on the power source of the semiconductor integrated circuit and the execution of the second ($T_6$ to $T_7$) normal operation (A/D_Conv), the intermediate ($T_4$ to $T_5$) calibration operation (Steady_Cal) is executed (see FIG. 27 to FIG. 31).

Another preferred embodiment is characterized in that after the execution of the first ($T_0$ to $T_1$) calibration operation (Int_Cal), prior to the execution of the first ($T_4$ to $T_5$) normal operation (A/D_Conv), the second ($T_2$ to $T_3$) calibration operation (Steady_Cal) is executed (see FIG. 28 to FIG. 31).

Figure 29:
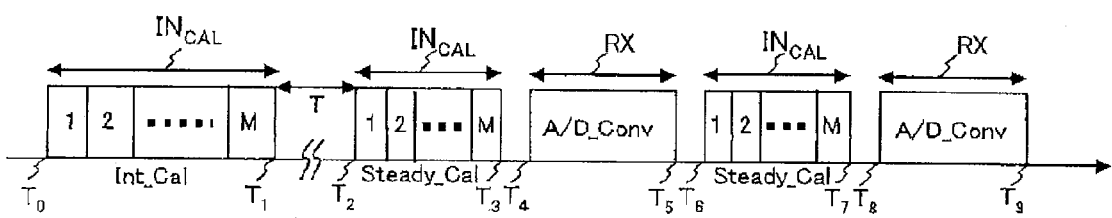
FIG. 29 is a diagram showing the calibration operation state and the normal operation state of the system LSI according to the fourth embodiment of the present invention in FIG. 10 or the eighth embodiment of the present invention in FIG. 20.
Figure 30:
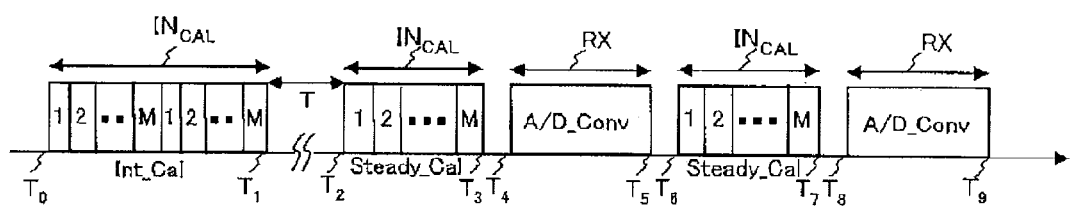
FIG. 30 is a diagram showing the calibration operation state and the normal operation state of the system LSI according to the fourth embodiment of the present invention in FIG. 10 or the eighth embodiment of the present invention in FIG. 20.

A more preferred embodiment is characterized in that during the calibration operation (Int_Cal, Steady_Cal), the digital calibration operation is executed sequentially for the capacitor elements ($C_1, C_2, \ldots, C_M$) of the multiplexer of the receiving interface (1) (see FIG. 29, FIG. 30).

2. Detailed Description of the Embodiments

Next, the embodiments are described in detail. In all the drawings for explaining the best modes to embody the present invention, the same symbol is attached to the component having the same function as that in the drawing and the repeated explanation thereof is omitted.

First Embodiment

<<Configuration of on-Vehicle Millimeter Wave Radar Device>>

FIG. 1 is a diagram showing a configuration of an on-vehicle millimeter wave radar device according to a first embodiment of the present invention, in which a semiconductor integrated circuit 100 as a system LSI incorporating a microprocessor unit and an A/D converter is mounted.

As shown in FIG. 1, the on-vehicle millimeter wave radar device comprises a transmitting antenna 103, a plurality of receiving antennas 106, 109, 112, a voltage controlled oscillator 101, an RF power amplifier 102, a plurality of analog front end parts 104, 107, 110, a plurality of RF reception units 105, 108, 111, and the system LSI 100.

The frequency of a millimeter wave transmission signal generated from the voltage controlled oscillator 101 is controlled by a control output signal from an output terminal OUT of the system LSI 100. The millimeter wave transmission signal generated from the voltage controlled oscillator 101 is amplified in power by the RF power amplifier 102 and then radiated from the transmitting antenna 103 ahead and ahead in the obliquely right and left directions. As a result of that, the reception signal as a reflected radio wave from a target ahead or ahead in the obliquely right and left directions is received by the receiving antennas 106, 109, 112 and supplied to one of a plurality of input terminals of a plurality of reception mixers of the RF reception units 105, 108, 111. On the other end, a partial signal of the millimeter wave transmission signal generated from the voltage controlled oscillator 101 is supplied as a reception carrier signal to the other input terminal of the reception mixers of the RF reception units 105, 108, 111, and therefore, a plurality of frequency down-converted reception signals is generated from a plurality of output terminals of the reception mixers of the RF reception units 105, 108, 111. Consequently, the frequency down-converted reception signals are supplied to a plurality of input terminals $IN_1, IN_2, \ldots, IN_M$ of the system LSI 100 via a plurality of low pass filters of the analog front end parts 104, 107, 110.

Second Embodiment

<<Configuration of System LSI in Second Embodiment>>

FIG. 2 is a diagram showing a configuration of the semiconductor integrated circuit 100 as a system LSI according to a second embodiment of the present invention mounted in the on-vehicle millimeter wave radar device according to the first embodiment of the present invention shown in FIG. 1 and incorporating a microprocessor unit and an A/D converter.

As shown in FIG. 2, the semiconductor integrated circuit 100 includes the input terminals $IN_1$, $IN_2$, ..., $IN_M$, a receiving interface 1, a single A/D converter 2, a correction signal generating unit 3, a digital correction D/A converter 4, a foreground digital correction digital correction unit 5, a radar calculation unit 6 for the on-vehicle millimeter wave radar device, a microprocessor unit (MPU) 7, a memory 8, a bus 9, and a reference voltage generating unit 10. The semiconductor integrated circuit 100 shown in FIG. 2 is a monolithic semiconductor integrated circuit, and therefore, all of the input terminals $IN_1$, $IN_2$, ..., $IN_M$, the receiving interface 1, the single A/D converter 2, the correction signal generating unit 3, the digital correction D/A converter 4, the foreground digital correction digital correction unit 5, the radar calculation unit 6 for the on-vehicle millimeter wave radar device, the microprocessor unit 7, the memory 8, the bus 9, and the reference voltage generating unit 10 are formed integrated inside a semiconductor chip of a monolithic semiconductor integrated circuit.

The semiconductor integrated circuit 100 as the system LSI according to the second embodiment of the present invention shown in FIG. 2 is characterized in that the single A/D converter 2, the correction signal generating unit 3, the digital correction D/A converter 4, the digital correction unit 5, and the receiving interface 1 constitute a foreground digital correction type A/D converter. As a result of that, it is made possible to realize a sufficiently high speed and a reduced area occupied by a chip for the single A/D converter 2 as a single A/D converter that sequentially A/D-converts a plurality of reception signals of the on-vehicle millimeter wave radar device.

<<Multiplexer of Receiving Interface>>

To the input terminals $IN_1$, $IN_2$, ..., $IN_M$ of the receiving interface 1, the frequency down-converted reception signals generated from the reception mixers of the RF receiving units 105, 108, 111 mounted in the on-vehicle millimeter wave radar device shown in FIG. 1 are supplied. The receiving interface 1 includes a multiplexer having a number of switches $SW_1$, $SW_2$, ..., $SW_M$, $SW_{CAL}$ between a multi-input terminal and a single-output terminal. The switches $SW_1$, $SW_2$, ..., $SW_M$ in large numbers of the multiplexer are coupled to the input terminals $IN_1$, $IN_2$, ..., $IN_M$ of the receiving interface 1 and the final $SW_{CAL}$ of the switches in large numbers of the multiplexer is coupled to an output terminal of the digital correction D/A converter 4. The single-output terminal coupled to the switches $SW_1$, $SW_2$, ..., $SW_M$, $SW_{CAL}$ in large numbers of the multiplexer is coupled to one terminal of a sample hold capacitor C and the other terminal of the sample hold capacitor C is coupled to a reference potential $V_{REF}$ via a sample hold switch SW and also coupled to an input terminal of the single A/D converter 2.

<<Single Pipeline Type A/D Converter>>

As the single A/D converter 2 of the semiconductor integrated circuit 100 as the system LSI according to the second embodiment of the present invention shown in FIG. 2, a pipeline type A/D converter is selected in particular.

As is well known, as an A/D converter, it is possible to select various A/D converters, such as a flash type, pipeline type, sequential comparison type, and sigma delta type. However, the flash type A/D converter can realize a very high sampling rate and a certain degree of resolution but its power consumption and the area occupied by a chip are large, and therefore, the flash type A/D converter was not selected as the single A/D converter 2 of the semiconductor integrated circuit 100. The sequential comparison type A/D converter can realize a comparatively high resolution, however, its sampling rate is very low, and therefore, the sequential comparison type A/D converter was not selected as the single A/D converter 2 of the semiconductor integrated circuit 100. The sigma delta type A/D converter can realize a very high resolution, however, the sampling rate is comparatively low, and therefore, the sigma delta type A/D converter was not selected as the A/D converter 2 of the semiconductor integrated circuit 100. On the contrary, according to the examination of the inventors of the present invention etc., the pipeline type A/D converter was selected as the single A/D converter 2 of the semiconductor integrated circuit 100 because it can realize a high sampling rate and a comparatively high resolution.

As is well known, the pipeline type A/D converter configured as the single A/D converter 2 of the semiconductor integrated circuit 100 as the system LSI according to the second embodiment of the present invention shown in FIG. 2 includes a plurality of multiplication type D/A converters $MDAC_1$, $MDAC_2$, ..., $MDAC_N$ that are cascade-coupled. Each of the cascade-coupled multiplication type D/A converters $MDAC_1$, $MDAC_2$, ..., $MDAC_N$ includes a sub A/D converter, a sub D/A converter, a subtracter, and an amplifier. An analog input signal of each multiplication type D/A converter is converted into a digital signal by the sub A/D converter and the digital signal is converted into an analog output signal by the sub D/A converter. The analog input signal of the multiplication type D/A converter and the analog output signal of the sub D/A converter are subjected to subtraction by the subtracter and a differential output signal of the subtracter is amplified by an amplifier the gain of which is set to 2 and an analog residual signal generated from an output of the amplifier is taken as an analog input signal of the multiplication type D/A converter in the next stage. In this manner, a multibit A/D-converted digital signal is generated from the single A/D converter 2 of the pipeline type A/D converter and supplied to the digital correction unit 5.

<<Foreground Calibration Operation>>

When turning on the power source of the semiconductor integrated circuit 100 as the system LSI according to the second embodiment of the present invention shown in FIG. 2, the operation mode of the semiconductor integrated circuit 100 is set to the foreground calibration operation. The setting of the operation mode is enabled by an initialization command when the power source is turned on.

Consequently, during the period of the foreground calibration operation by the single A/D converter 2, the correction signal generating unit 3, the digital correction D/A converter 4, the digital correction unit 5, and the receiving interface 1, the calibration operation is executed as follows.

That is, during the period of the calibration operation, a calibration digital signal generated from the correction signal generating unit 3 is supplied to the digital input terminal of the digital correction D/A converter 4. Consequently, a calibration analog signal $IN_{CAL}$ is generated from the analog output terminal of the digital correction D/A converter 4 and supplied to the analog input terminal of the single A/D converter 2 via the final switch $SW_{CAL}$ of the multiplexer included in the receiving interface 1. As a result of that, from the digital output terminal of the single A/D converter 2, a digital output signal in response to the calibration analog signal $IN_{CAL}$ of the digital correction D/A converter 4 is generated. The digital output signal of the single A/D converter 2 is supplied to a digital output generation unit 51 and a foreground calibration unit 52 inside the digital correction unit 5 and the calibration digital signal of the correction signal generating unit 3 and the final digital output signal of the digital output generation unit 51 are supplied to the foreground calibration unit 52 and the output of the foreground calibration unit 52 is supplied to the digital output generation unit 51. Consequently, the digital output generation unit 51 is controlled by the output of the foreground calibration unit 52 so that the calibration digital signal supplied to the foreground calibration unit 52 and the final digital output signal of the digital output generation unit 51 agree with each other.

<<Normal Operation>>

By the execution of the foreground calibration operation described above, a digital correction data corresponding to the digital output signal of the single A/D converter 2 is stored in the digital output generation unit 51 of the digital correction unit 5. Further, after the execution of the foreground calibration operation is completed, the normal operation mode of the semiconductor integrated circuit 100 as the system LSI according to the second embodiment of the present invention shown in FIG. 2 is set. This is enabled by supplying a normal operation mode transition command to move the operation mode of the semiconductor integrated circuit 100 into the normal operation mode to the semiconductor integrated circuit 100.

As described above, when the transition of the operation mode of the semiconductor integrated circuit 100 into the normal operation mode is completed, the single A/D converter 2 sequentially A/D-converts the reception signals of the reception mixers of the on-vehicle millimeter wave radar device output from the output terminal of the multiplexer of the receiving interface 1. At this time, the digital output generation unit 51 of the digital correction unit 5 executes correction processing of a digital output signal generated from the output terminal of the single A/D converter 2 by using digital correction data stored inside thereof. As a result of that, in the normal operation mode, it is made possible to generate a normal operation digital correction output signal with high precision and resolution from the output terminal of the digital output generation unit 51 of the digital correction unit 5.

<<High Precision Control of Distance Between Automobiles>>

By the calibration operation described above, it is made possible to make high the resolution of the foreground digital correction type A/D converter including the single A/D converter 2, the correction signal generating unit 3, the digital correction D/A converter 4, the digital correction unit 5, and the receiving interface 1. As a result of that, it is made possible for the on-vehicle millimeter wave radar device according to the first embodiment of the present invention shown in FIG. 1 to calculate the distance, relative speed, and orientation information of an object with high precision. Consequently, it is made possible for an automobile mounting the on-vehicle millimeter wave radar device shown in FIG. 1 to travel very safely.

That is, the reception digital signal output sequentially from the output of the single A/D converter 2 in response to the reception signal of the receiving antennas is subjected to digital calculation processing by the radar calculation unit 6 for the on-vehicle millimeter wave radar device. When the value of the distance to an automobile ahead or ahead in the obliquely right/left direction becomes one indicative of danger, the data of the result of digital calculation processing by the radar calculation unit 6 is a value reflecting the danger. Consequently, in such a circumstance, it is possible to avoid a traffic accident by the microprocessor unit (MPU) 7 executing engine control or brake control of an automobile in response to the result of digital calculation processing by the radar calculation unit 6 supplied via the bus 9. It is made possible to execute engine control or brake control of an automobile by the microprocessor unit 7 in response to the result of digital calculation processing by the radar calculation unit 6 by the software stored in a nonvolatile memory of the memory 8. Further, it is also possible to execute the digital calculation processing by the radar calculation unit 6 not only by the hardware of the radar calculation unit 6 but also by the software stored in the nonvolatile memory of the memory 8.

<<Specific Configuration of Receiving Interface>>

Figure 3:
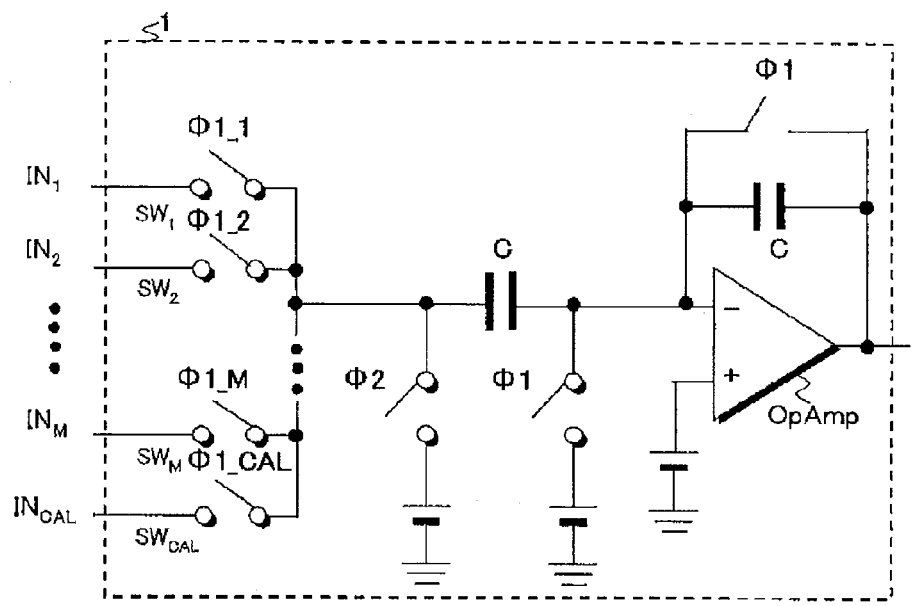
FIG. 3 is a diagram showing a specific configuration of a receiving interface 1 of the semiconductor integrated circuit 100 as the system LSI according to the second embodiment of the present invention shown in FIG. 2.

FIG. 3 is a diagram showing a specific configuration of the receiving interface 1 of the semiconductor integrated circuit 100 as the system LSI according to the second embodiment of the present invention shown in FIG. 2.

The receiving interface 1 shown in FIG. 3 includes the multiplexer having the switches $SW_1$, $SW_2$, ..., $SW_M$, $SW_{CAL}$ in large numbers between the multi-input terminal and the single-output terminal. The ON state and OFF state of the switches $SW_1$, $SW_2$, ..., $SW_M$, $SW_{CAL}$ in large numbers are controlled by the high level and low level of multiphase control signals $\Phi1\_1$, $\Phi1\_2$, ..., $\Phi1\_M$, $\Phi1\_CAL$. In the receiving interface 1, the sample hold circuit further includes a switch the ON state and OFF state of which are controlled by two-phase clock signals $\phi1$, $\phi2$, the capacitor C, an operational amplifier OpAmp, and the multiplexer described above.

Figure 5:
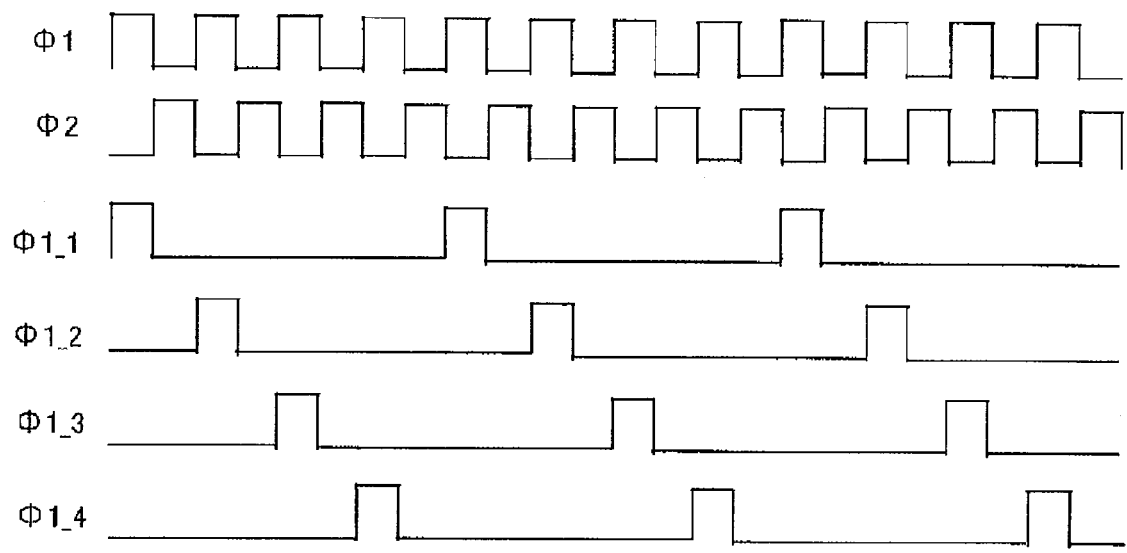
FIG. 5 is a diagram showing waveforms of two-phase clock signals $\phi 1$, $\phi 2$ and multiphase control signals $\Phi 1\_1$, $\Phi\_2, \ldots$, to cause a plurality of switches $SW_1, SW_2, \ldots, SW_M$ of a multiplexer included in the receiving interface 1 shown in FIG. 3 to execute a sample hold operation.

FIG. 5 is a diagram showing waveforms of the two-phase clock signals $\phi1$, $\phi2$ and the multiphase control signals $\Phi1\_1$, $\Phi1\_2$, to cause the switches $SW_1$, $SW_2$, ..., $SW_M$ of the multiplexer included in the receiving interface 1 shown in FIG. 3 to execute the sample hold operation.

As shown in FIG. 5, during the sampling period of the high level of the first clock signal $\phi1$, any of the multiphase signals $\Phi1\_1$, $\Phi1\_2$, ..., turns to the high level, any of the switches $SW_1$, $SW_2$, ..., $SW_M$ enters the ON state, and the analog input signal is sampled between both ends of the first capacitor C coupled to the single-output terminal of the multiplexer.

Next, during the hold period of the high level of the second clock signal $\phi2$, the charges of the first capacitor C are transferred to the second capacitor C coupled between the inverted input terminal and the output terminal of the operational amplifier OpAmp.

Figure 6:
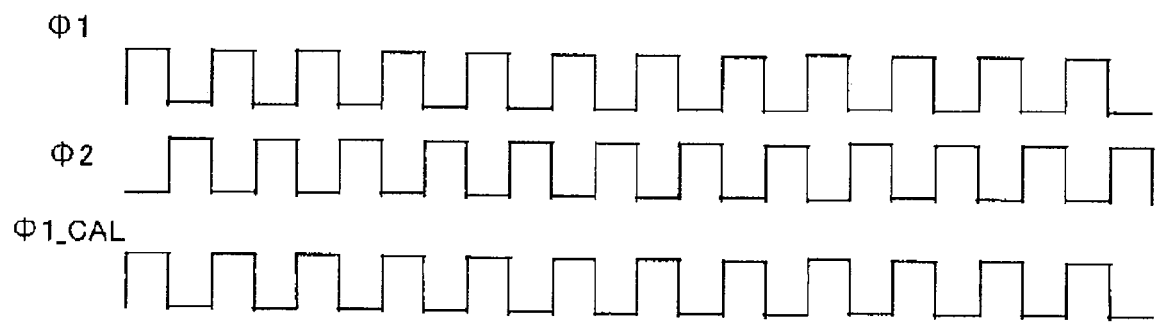
FIG. 6 is a diagram showing waveforms of the two-phase clock signals $\phi 1$, $\phi 2$ and a control signal $\Phi 1\_CAL$ to cause a final switch $SW_{CAL}$ of the multiplexer included in the receiving interface 1 shown in FIG. 3 to execute a sample hold operation.

FIG. 6 is a diagram showing waveforms of the two-phase clock signals $\phi1$, $\phi2$ and the control signal $\Phi1\_CAL$ to cause the final switch $SW_{CAL}$ of the multiplexer included in the receiving interface 1 shown in FIG. 3 to execute the sample hold operation.

As shown in FIG. 6, during the sampling period during which the first clock signal $\phi1$ is at the high level, the final control signal $\Phi1\_CAL$ turns to the high level and the final switch $SW_{CAL}$ enters the ON state, and the calibration analog input signal from the digital correction D/A converter 4 is sampled between both ends of the first capacitor C coupled to the single-output terminal of the multiplexer. Next, during the hold period during which the second clock signal $\phi2$ is at the high level, the charges of the first capacitor C are transferred to the second capacitor C coupled between the inverted input terminal and the output terminal of the operational amplifier OpAmp.

Figure 4:
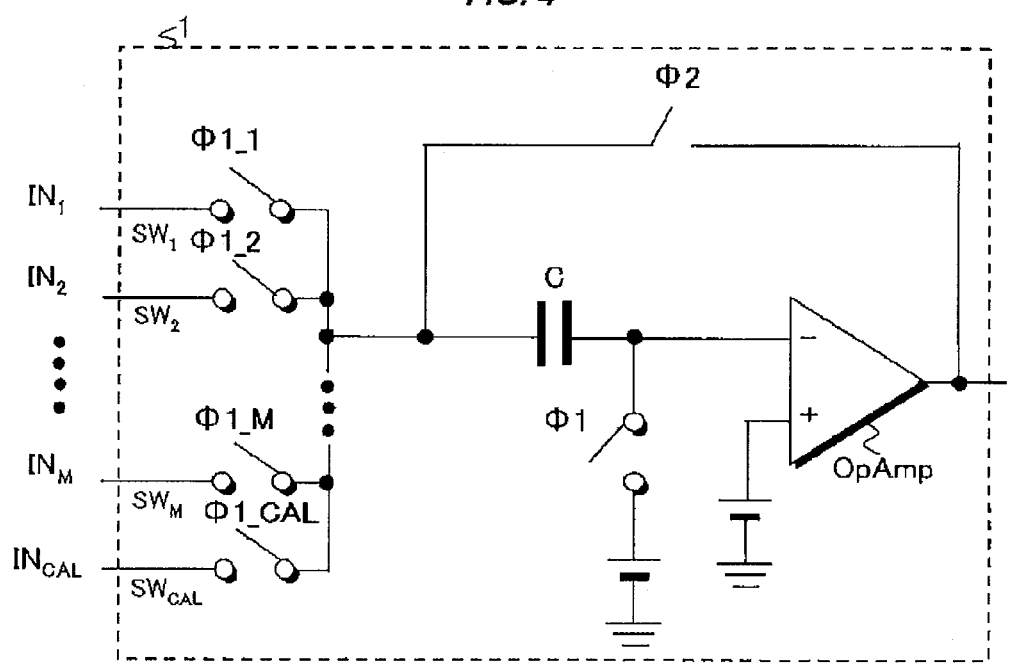
FIG. 4 is a diagram showing another specific configuration of the receiving interface 1 of the semiconductor integrated circuit 100 as the system LSI according to the second embodiment of the present invention shown in FIG. 2.

FIG. 4 is a diagram showing another specific configuration of the receiving interface 1 of the semiconductor integrated circuit 100 as the system LSI according to the second embodiment of the present invention shown in FIG. 2. The other specific configuration of the receiving interface 1 shown in FIG. 4 is substantially the same as the specific configuration of the receiving interface 1 shown in FIG. 3. It is also possible for the receiving interface 1 shown in FIG. 4 to execute the sample hold operation with waveforms shown in FIG. 5 and FIG. 6.

Third Embodiment

<<Configuration of System LSI in Third Embodiment>>

FIG. 7 is a diagram showing a configuration of the semiconductor integrated circuit 100 as a system LSI according to a third embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the third embodiment of the present invention shown in FIG. 7 differs from the semiconductor integrated circuit 100 according to the second embodiment of the present invention shown in FIG. 2 in the following point.

That is in the receiving interface 1 of the semiconductor integrated circuit 100 in FIG. 7, the sample hold capacitor C and the sample hold switch SW of the receiving interface 1 of the semiconductor integrated circuit 100 in FIG. 2 are omitted. Consequently, compared to the semiconductor integrated circuit 100 in FIG. 2, in the semiconductor integrated circuit 100 according to the third embodiment of the present invention shown in FIG. 7, the area occupied by the semiconductor chip and the consumed current can be reduced.

FIG. 8 is a diagram showing a configuration of a pipeline type A/D converter as the single A/D converter 2 which enables the omission of the sample hold capacitor C and the sample hold switch SW in the receiving interface 1 of the semiconductor integrated circuit 100 according to the third embodiment of the present invention shown in FIG. 7.

As shown in FIG. 8, to the single-output terminal of the switches $SW_1$, $SW_2$, . . . , $SW_M$ in large numbers of the multiplexer of the receiving interface 1, the multiplication type D/A converter $MDAC_1$ in the first stage of the cascade-coupled multiplication type D/A converters $MDAC_1$, $MDAC_2$, . . . , $MDAC_N$ constituting the single A/D converter 2 is coupled. The multiplication type D/A converter $MDAC_1$ in the first stage includes a sub A/D converter SADC, a sub D/A converter SDAC, a subtracter Node, and an amplifier X2. The input terminal of the sub A/D converter SADC is coupled to the single-output terminal of the multiplexer of the receiving interface 1 via a switch controlled by the first clock signal $\phi 1$. Consequently, in response to the analog input signal of the single-output terminal of the multiplexer of the receiving interface 1, a 1.5-bit digital output signal is generated from the output terminal of the sub A/D converter SADC and supplied to the digital input terminal of the sub D/A converter SDAC. As a result of that, in response to the 1.5-bit digital output signal of the sub A/D converter SADC, any of a high level analog output voltage Vp, an intermediate level analog output voltage Vc, and a low level analog output voltage Vn is selected by the sub D/A converter SDAC.

As shown in FIG. 8, the amplifier X2 includes an input capacitor the capacitance value of which is set to 2C, feedback capacitor the capacitance value of which is set to C, two switches controlled by the first clock signal $\phi 1$, and the operational amplifier OpAmp. Consequently, during the high level period of the first clock signal $\phi 1$, the analog input voltage of the single-output terminal of the multiplexer of the receiving interface 1 is supplied between both ends of the input terminal of the sub A/D converter SADC and the input capacitor having a capacitance value of 2C of the amplifier X2. During the next high level period of the second clock signal $\phi 2$, in the subtracter Node, a differential output voltage between the analog input voltage of the sub A/D converter SADC and the analog output voltage of the sub D/A converter SDAC is generated. The differential output voltage generated from the subtracter Node is amplified by the amplifier X2 the gain of which is set to 2 by the input capacitor having a capacitance value of 2C and the feedback capacitor having a capacitance value C and an analog residual signal generated from the output of the amplifier X2 is supplied to the input terminal of the multiplication type D/A converter $MDAC_2$ in the second stage. It is also possible for the multiplication type D/A converter $MDAC_2$ in the second stage to the multiplication type D/A converter $MDAC_N$ in the final stage to include the amplifier X2 including the input capacitor having a capacitance value of 2C, the feedback capacitor having a capacitance value C, the two switches controlled by the first clock signal $\phi 1$, and the operational amplifier OpAmp, the sub A/D converter SADC, the sub D/A converter SDAC, and the subtracter Node in quite the same way as the multiplication type D/A converter $MDAC_1$ in the first stage.

Figure 9:
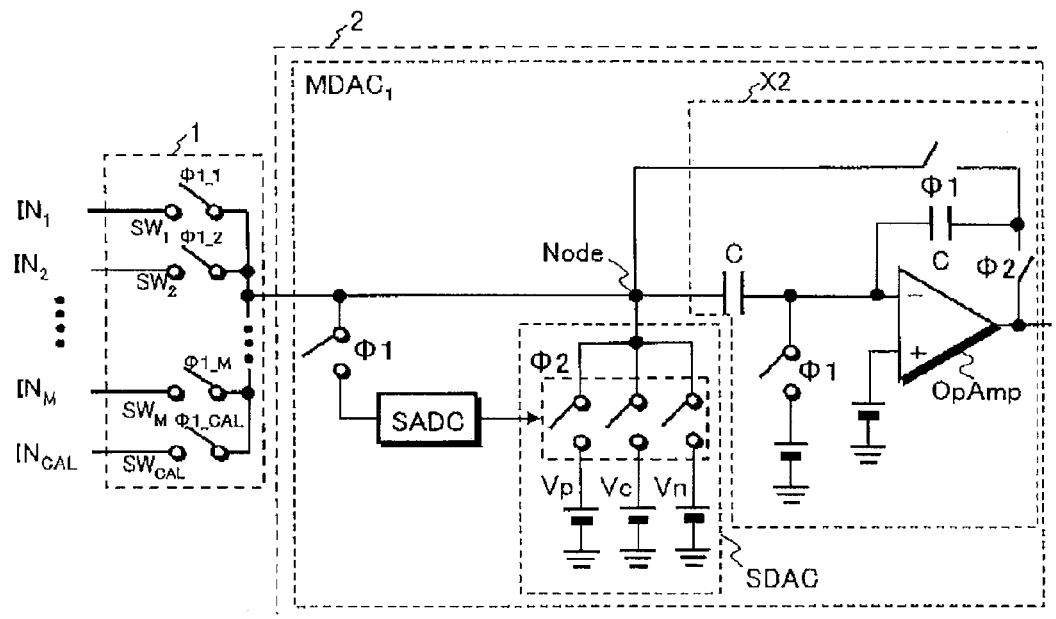
FIG. 9 is a diagram showing another configuration of the pipeline type A/D converter as the single A/D converter 2 which enables omission of the sample hold capacitor C and the sample hold switch SW in the receiving interface 1 of the semiconductor integrated circuit 100 according to the third embodiment of the present invention shown in FIG. 7.

FIG. 9 is a diagram showing another configuration of the pipeline type A/D converter as the single A/D converter 2 which enables the omission of the sample hold capacitor C and the sample hold switch SW in the receiving interface 1 of the semiconductor integrated circuit 100 according to the third embodiment of the present invention shown in FIG. 7.

The other configuration of the pipeline type A/D converter as the single A/D converter 2 shown in FIG. 9 differs from the configuration of the pipeline type A/D converter as the single A/D converter 2 shown in FIG. 8 in the following point.

That is, the difference from the configuration of the pipeline type A/D converter shown in FIG. 8 lies in that the amplifier X2 of the multiplication type D/A converter $MDAC_1$ in the first stage shown in FIG. 9 includes the input capacitor having a capacitance value of C, the feedback capacitor having a capacitance value of C, the two switches controlled by the first clock signal $\phi 1$, one switch controlled by the second clock signal $\phi 2$, and the operational amplifier OpAmp. The basic operation of the pipeline type A/D converter as the single A/D converter 2 shown in FIG. 9 is the same as the operation of the pipeline type A/D converter shown in FIG. 8, and therefore, its explanation is omitted here.

Fourth Embodiment

<<Configuration of System LSI in Fourth Embodiment>>

FIG. 10 is a diagram showing a configuration of the semiconductor integrated circuit 100 as a system LSI according to a fourth embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the fourth embodiment of the present invention shown in FIG. 10 differs from the semiconductor integrated circuit 100 according to the second embodiment of the present invention shown in FIG. 2 in the following point.

That is, in the receiving interface 1 of the semiconductor integrated circuit 100 in FIG. 10, a plurality of sample hold capacitors $C_1$, $C_2$, . . . , $C_M$ is arranged in order to realize simultaneous sampling in a plurality of channels of the input terminals $IN_1$, $IN_2$, . . . , $IN_M$ of the multiplexer. Consequently, when the system LSI of the semiconductor integrated circuit 100 according to the fourth embodiment of the present invention in FIG. 10 is mounted in the on-vehicle millimeter wave radar device in the first embodiment of the present invention shown in FIG. 1, the following advantage is obtained.

That is, simultaneous sampling is realized by the sample hold capacitors $C_1$, $C_2$, . . . , $C_M$, and therefore, it is made possible to simultaneously receive the reflected radio waves from the millimeter waves generated from the transmitting antenna 103 by the receiving antennas 106, 109, 112 and to simultaneously sample the reception signals of the receiving antennas 106, 106, 112 by the sample hold capacitors $C_1$, $C_2$, ..., $C_M$. In this case, it is made possible for the on-vehicle millimeter wave radar device to calculate the distance, relative speed, orientation information of a target object with higher precision.

Further, in the semiconductor integrated circuit 100 according to the fourth embodiment of the present invention shown in FIG. 10, the following modifications are made by the arrangement of the sample hold capacitors $C_1$, $C_2$, ..., $C_M$ in the receiving interface 1.

That is, the first modification is that a plurality of ends of the sample hold capacitors $C_1$, $C_2$, ..., $C_M$ is coupled to the input terminals $IN_1$, $IN_2$, ..., $IN_M$ of the multiplexer and further to one end of the final switches $SW_{CAL\ 1}$, $SW_{CAL\ 2}$, ..., $SW_{CAL\ M}$, and to the other end of the final switches $SW_{CAL\ 1}$, $SW_{CAL\ 2}$, ..., $SW_{CAL\ M}$, the calibration analog signal $IN_{CAL}$ generated from the digital correction D/A converter 4 is supplied commonly. Furthermore, for which switch of the final switches $SW_{CAL\ 1}$, $SW_{CAL\ 2}$, ..., $SW_{CAL\ M}$, the ON state is selected is controlled by a plurality of control signals generated from a correction multiplex controller 11. The control signals generated from the correction multiplex controller 11 are supplied similarly to the digital correction unit 5 for foreground calibration. Further, the other ends of the sample hold capacitors $C_1$, $C_2$, ..., $C_M$ are coupled commonly to the reference potential $V_{REF}$ via the sample hold switches SW.

Consequently, in the foreground calibration operation of the semiconductor integrated circuit 100 according to the fourth embodiment of the present invention shown in FIG. 10, the final switches $SW_{CAL\ 1}$, $SW_{CAL\ 2}$, $SW_{CAL\ M}$ are controlled into the ON state sequentially by the control signals generated from the correction multiplex controller 11. That is, while the first switch $SW_{CAL\ 1}$ is in the ON state, the calibration analog signal $IN_{CAL}$ is supplied to the first sample hold capacitor $C_1$ and the foreground calibration operation is executed by the digital correction unit 5 for the A/D-converted output digital signal of the single A/D converter 2 having the supplied analog input voltage of the first sample hold capacitor $C_1$. At this time, the foreground calibration operation is executed so that an A/D-converted output digital signal with high precision and high resolution is generated from the output of the single A/D converter 2 even if there is a capacitance value error of the first sample hold capacitor $C_1$. Next, while the second switch $SW_{CAL\ 2}$ is in the ON state, the calibration analog signal $IN_{CAL}$ is supplied to the second sample hold capacitor $C_2$ and the foreground calibration operation is executed by the digital correction unit 5 for the A/D-converted output digital signal of the single A/D converter 2 having the supplied analog input voltage of the second sample hold capacitor $C_2$. At this time, the foreground calibration operation is executed so that an A/D-converted output digital signal with high precision and high resolution is generated from the output of the single A/D converter 2 even if there is a capacitance value error of the second sample hold capacitor $C_2$. Finally, while the M-th switch $SW_{CAL\ M}$ is in the ON state, the calibration analog signal $IN_{CAL}$ is supplied to the M-th sample hold capacitor $C_M$ and the foreground calibration operation is executed by the digital correction unit 5 for the A/D-converted output digital signal of the single A/D converter 2 having the supplied analog input voltage of the M-th sample hold capacitor $C_M$. At this time, the foreground calibration operation is executed so that an A/D-converted output digital signal with high precision and high resolution is generated from the output of the single A/D converter 2 even if there is a capacitance value error of the M-th sample hold capacitor $C_M$.

<<Simultaneous Sampling Operation and Calibration Operation>>

Figure 11:
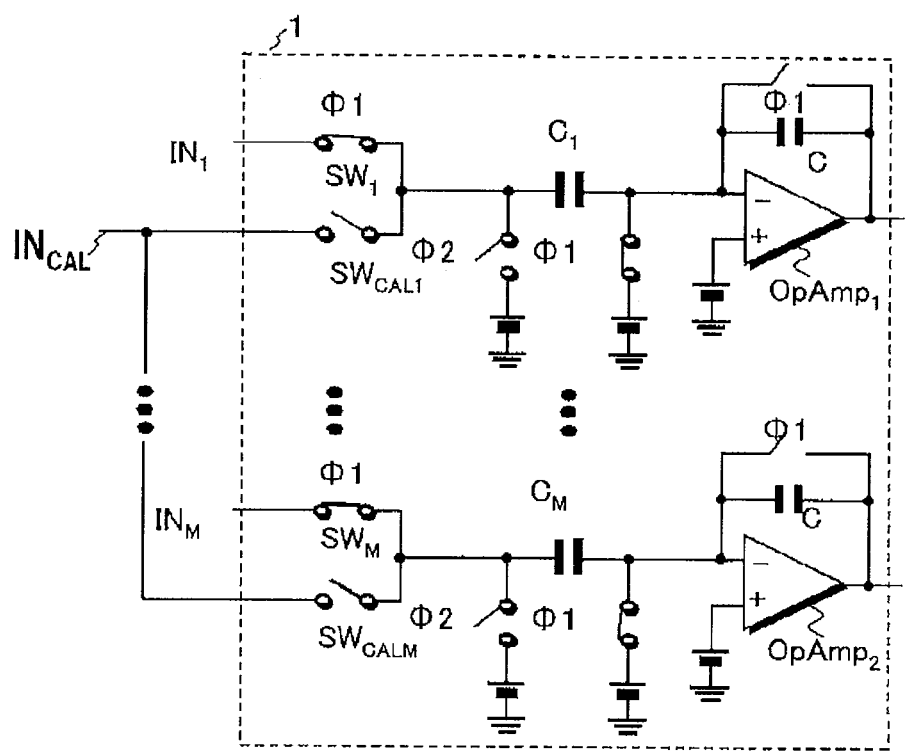
FIG. 11 is a diagram for explaining a simultaneous sampling operation of the receiving interface 1 of the semiconductor integrated circuit 100 as the system LSI according to the fourth embodiment of the present invention shown in FIG. 10.

FIG. 11 is a diagram for explaining the simultaneous sampling operation of the receiving interface 1 of the semiconductor integrated circuit 100 as the system LSI according to the fourth embodiment of the present invention shown in FIG. 10.

In the receiving interface 1 shown in FIG. 11, the switches $SW_1$, $SW_2$, ..., $SW_M$ coupled between the input terminals $IN_1$, $IN_2$, ..., $IN_M$ of the multiplexer and the ends of the sample hold capacitors $C_1$, $C_2$, ..., $C_M$ are controlled into the ON state at the same time by the first clock signal $\phi 1$. As a result of that, it is made possible for the reception signals of the receiving antennas 106, 109, 112 to be sampled simultaneously by the hold capacitors $C_1$, $C_2$, ..., $C_M$ due to the switches $SW_1$, $SW_2$, ..., $SW_M$ controlled into the ON state at the same time.

Figure 12:
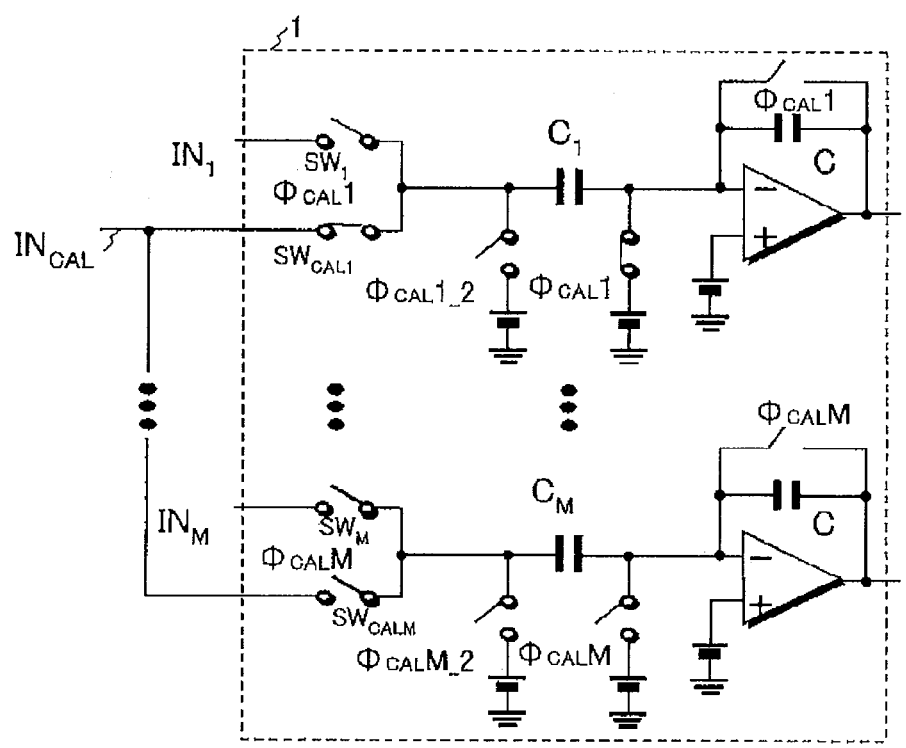
FIG. 12 is a diagram for explaining a foreground calibration operation of the receiving interface 1 of the semiconductor integrated circuit 100 as the system LSI according to the fourth embodiment of the present invention shown in FIG. 10.

FIG. 12 is a diagram for explaining the foreground calibration operation of the receiving interface 1 of the semiconductor integrated circuit 100 as the system LSI according to the fourth embodiment of the present invention shown in FIG. 10.

In the receiving interface 1 shown in FIG. 12, the final switches $SW_{CAL\ 1}$, $SW_{CAL\ 2}$, ..., $SW_{CAL\ M}$ are controlled into the ON state sequentially by the control signals $\Phi_{CAL}1$, $\Phi_{CAL}2$, ..., $\Phi_{CAL}M$ generated from the correction multiplex controller 11. FIG. 12 shows the way the calibration analog signal $IN_{CAL}$ is supplied to the first sample hold capacitor $C_1$ while the first switch $SW_{CAL\ 1}$ is in the ON state. Due to that, the foreground calibration operation is executed by the digital correction unit 5 for the A/D-converted output digital signal of the single A/D converter 2 having the supplied analog input voltage of the first sample hold capacitor $C_1$.

FIG. 13 is a diagram showing a specific configuration of the multiplication type D/A converter $MDAC_1$ in the first stage of the cascade-coupled multiplication type D/A converters constituting the receiving interface 1 and the single A/D converter 2 of the semiconductor integrated circuit 100 according to the fourth embodiment of the present invention shown in FIG. 10.

As shown in FIG. 13, the other ends of the sample hold capacitors $C_1$, $C_2$, ..., $C_M$ of the receiving interface 1 are coupled to the single-output terminal of the multiplexer via the switches $sw_1$, $sw_2$, ..., $sw_M$ as the multi-input terminal of the multiplexer. The switches $sw_1$, $sw_2$, ..., $sw_M$ of the multiplexer are controlled by the multiphase control signals $\phi 2\_1$, $\phi 2\_2$, $\phi 2\_M$. The single-output terminal of the multiplexer including the switches $sw_1$, $sw_2$, ..., $sw_M$ is coupled to the input terminal of the multiplication type D/A converter $MDAC_1$ in the first stage of the cascade-coupled multiplication type D/A converters of the single A/D converter 2 including the pipeline type A/D converter.

The multiplication type D/A converter $MDAC_1$ in the first stage shown in FIG. 13 also includes the sub A/D converter SADC, the sub D/A converter SDAC, the subtracter Node, and the amplifier X2 as the multiplication type D/A converter $MDAC_1$ in the first stage shown in FIG. 8 does.

Figure 14:
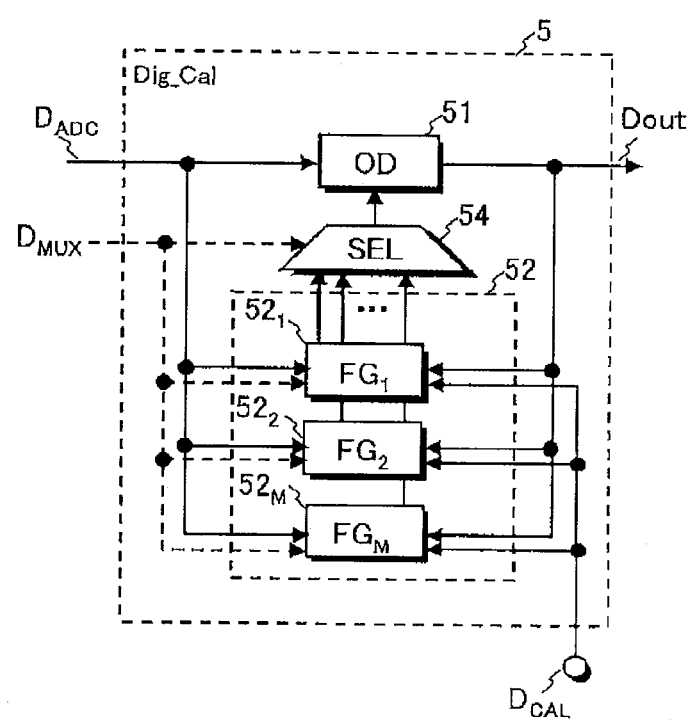
FIG. 14 is a diagram showing a configuration of a digital correction unit 5 used in the foreground calibration operation of the semiconductor integrated circuit 100 according to the fourth embodiment of the present invention shown in FIG. 10 and FIG. 13.

FIG. 14 is a diagram showing the configuration of the digital correction unit 5 used in the foreground calibration operation of the semiconductor integrated circuit 100 according to the fourth embodiment of the present invention shown in FIG. 10 and FIG. 13.

As shown in FIG. 14, the digital correction unit 5 includes the digital output generation unit 51, a plurality of calibration units $52_1$, $52_2$, ..., $52_M$ of the foreground calibration unit 52, and a selector 54.

A digital output signal $D_{ADC}$ of the single A/D converter 2 is supplied to the digital output generation unit 51 inside the digital correction unit 5 and the calibration units $52_1$, $52_2$, ..., $52_M$ of the foreground calibration unit 52 and a calibration digital signal $D_{CAL}$ of the correction signal generating unit 3 and a final digital output signal $D_{OUT}$ of the digital output generation unit 51 are supplied to the calibration units $52_1$, $52_2$, ..., $52_M$ of the foreground calibration unit 52. The outputs of the calibration units $52_1$, $52_2$, ..., $52_M$ of the foreground calibration unit 52 are selected by the selector 54 and supplied to the digital output generation unit 51.

When the final switches $SW_{CAL\ 1}, SW_{CAL\ 2}, ..., SW_{CAL\ M}$ of the receiving interface 1 shown in FIG. 10 and FIG. 13 are controlled sequentially into the ON state by a control signal $D_{MUX}$ generated from the correction multiplex controller 11, the control signal $D_{MUX}$ is supplied to the selector 54 of the digital correction unit 5 shown in FIG. 14 and the calibration units $52_1, 52_2, ..., 52_M$ of the foreground calibration unit 52.

First, when the first switch $SW_{CAL\ 1}$ is controlled into the ON state and the foreground calibration operation is executed by the digital correction unit 5 for the first sample hold capacitor $C_1$, the first calibration unit $52_1$ of the calibration unit 52 is selected by the control signal $D_{MUX}$ of the correction multiplex controller 11. Consequently, the digital output generation unit 51 is controlled by the output of the first calibration unit $52_1$ of the foreground calibration unit 52 supplied from the selector 54 so that the calibration digital signal $D_{CAL}$ supplied to the first calibration unit $52_1$ and the final digital output signal $D_{OUT}$ of the digital output generation unit 51 agree with each other with respect to the digital output signal $D_{ADC}$ of the single A/D converter 2 of the first sample hold capacitor $C_1$.

Next, when the second switch $SW_{CAL\ 2}$ is controlled into the ON state and the foreground calibration operation is executed by the digital correction unit 5 for the second sample hold capacitor $C_2$, the second calibration unit $52_2$ of the calibration unit 52 is selected by the control signal $D_{MUX}$ of the correction multiplex controller 11. Consequently, the digital output generation unit 51 is controlled by the output of the second calibration unit $52_2$ of the foreground calibration unit 52 supplied from the selector 54 so that the calibration digital signal $D_{CAL}$ supplied to the second calibration unit $52_2$ and the final digital output signal $D_{OUT}$ of the digital output generation unit 51 agree with each other with respect to the digital output signal $D_{ADC}$ of the single A/D converter 2 of the second sample hold capacitor $C_2$.

Finally, when the M-th switch $SW_{CAL\ M}$ is controlled into the ON state and the foreground calibration operation is executed by the digital correction unit 5 for the M-th sample hold capacitor $C_M$, the M-th calibration unit $52_M$ of the calibration unit 52 is selected by the control signal $D_{MUX}$ of the correction multiplex controller 11. Consequently, the digital output generating unit 51 is controlled by the output of the M-th calibration unit $52_M$ of the foreground calibration unit 52 supplied from the selector 54 so that the calibration digital signal $D_{CAL}$ supplied to the M-th calibration unit $52_M$ and the final digital output signal $D_{OUT}$ of the digital output generation unit 51 agree with each other with respect to the digital output signal $D_{ADC}$ of the single A/D converter 2 of the M-th sample hold capacitor $C_M$.

Figure 15:
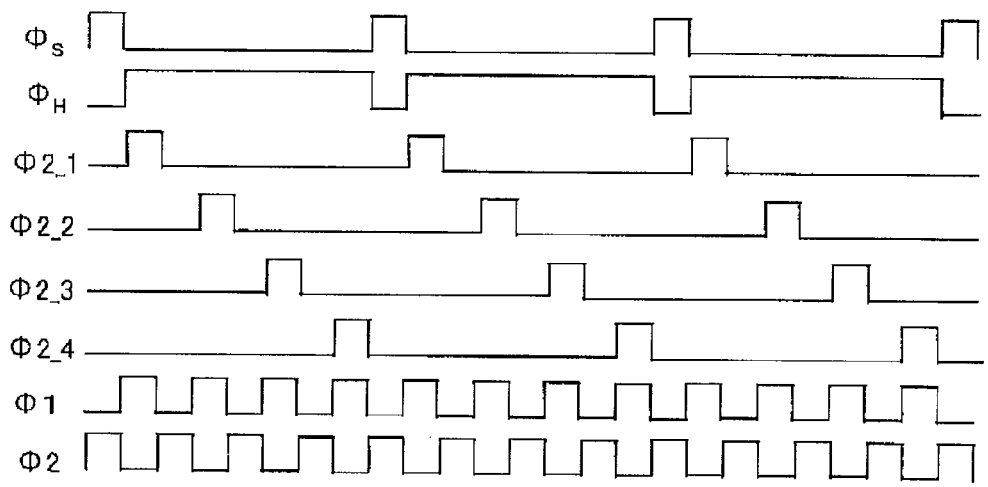
FIG. 15 is a diagram showing that a plurality of sample hold capacitors $C_1, C_2, \ldots, C_M$ of the receiving interface 1 of the semiconductor integrated circuit 100 according to the fourth embodiment of the present invention shown in FIG. 10 can simultaneously execute sampling of reception signals of a plurality of receiving antennas and the way the single A/D converter 2 sequentially A/D-converts analog voltages of the sample hold capacitors $C_1, C_2, \ldots C_M$.

FIG. 15 is a diagram showing that the reception signals of the receiving antennas can be sampled at the same time by the sample hold capacitors $C_1, C_2, ..., C_M$ of the receiving antennal of the semiconductor integrated circuit 100 according to the fourth embodiment of the present invention shown in FIG. 10 and the way the single A/D converter 2 sequentially A/D-converts the analog voltages of the sample hold capacitors $C_1, C_2, ..., C_M$.

As shown in FIG. 15, during the high level period of the sampling pulse $\phi_S$, the switches $SW_1, SW_2, ..., SW_M$ of the receiving interface 1 of the semiconductor integrated circuit 100 according to the fourth embodiment of the present invention shown in FIG. 10 are controlled into the ON state at the same time by the first clock signal $\phi 1$. As a result of that, it is made possible for the reception signals of the receiving antennas 106, 109, 112 to be sampled at the same time by the hold capacitors $C_1, C_2, ..., C_M$ due to the switches $SW_1, SW_2, ..., SW_M$ controlled into the ON state at the same time.

During the hold period (high level period of a hold pulse $\phi_H$) of the low level period of the sampling pulse $\phi_S$, the pulses of the multiphase control signals $\phi 2\_1, \phi 2\_2, ..., \phi 2\_M$ are sequentially controlled into the high level. As a result of that, the switches $SW_1, sw_2, ..., sw_M$ of the multiplexer coupled to the sample hold capacitors $C_1, C_2, ..., C_M$ of the receiving interface 1 are controlled sequentially into the ON state by the multiphase control signals $\phi 2\_1, \phi 2\_2, ..., \phi 2\_M$.

During the first high level period of the first clock signal $\phi 1$, the analog voltage of the first sample hold capacitor $C_1$ is supplied to the input terminal of the sub A/D converter SADC of the multiplication type D/A converter $MDAC_1$ in the first stage of the single A/D converter 2. During the second high level period of the second clock signal $\phi 2$ after the first high level period of the first clock signal $\phi 1$, the sub D/A converter SDCA of the multiplication type D/A converter $DAC_1$ in the first stage of the single A/D converter 2 is activated. Consequently, the analog residual signal generated from the multiplication type D/A converter $DAC_1$ in the first stage is supplied to the analog input terminal of the multiplication type D/A converter $DAC_2$ in the next stage.

Next, during the second high level period of the first clock signal $\phi 1$, the analog voltage of the second sample hold capacitor $C_2$ is supplied to the input terminal of the sub A/D converter SADC of the multiplication type D/A converter $MDAC_1$ in the first stage of the single A/D converter 2. During the third high level period of the second clock signal $\phi 2$ after the second high level period of the first clock signal $\phi 1$, the sub D/A converter SDCA of the multiplication type D/A converter $DAC_1$ in the first stage of the single A/D converter 2 is activated. Consequently, the analog residual signal generated from the multiplication type D/A converter $MDAC_1$ in the first stage is supplied to the analog input terminal of the multiplication type D/A converter $DAC_2$ in the next stage.

Figure 16:
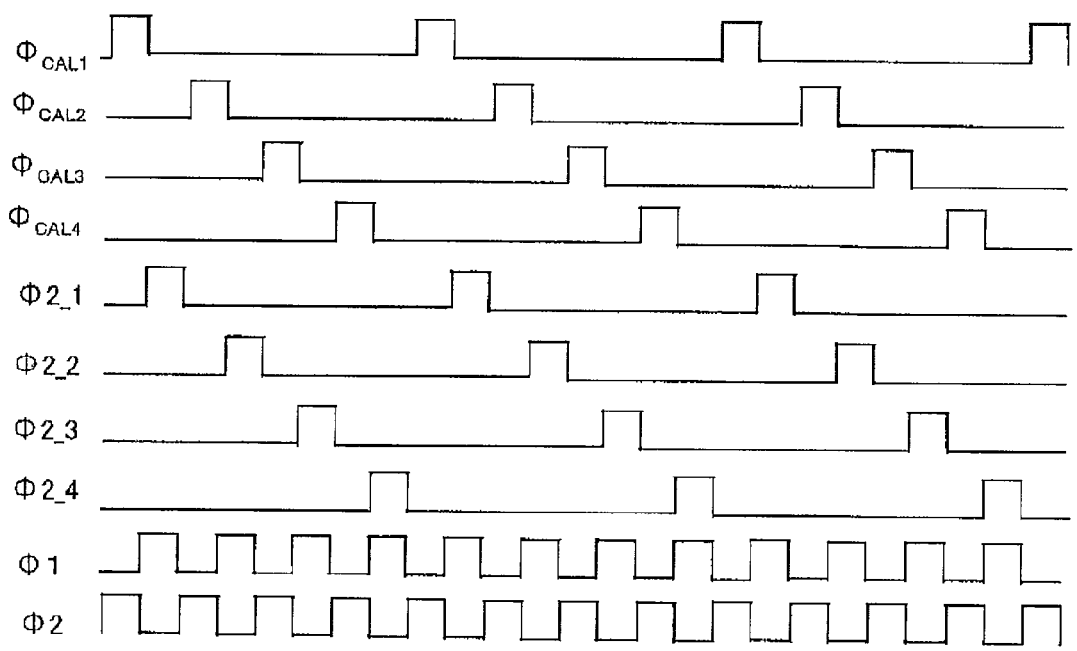
FIG. 16 is a diagram showing the way a calibration analog signal $IN_{CAL}$ generated from a digital correction D/A converter 4 is sequentially supplied to the sample hold capacitors $C_1, C_2, \ldots, C_M$ of the receiving interface 1 during the period of foreground calibration operation of the semiconductor integrated circuit 100 according to the fourth embodiment of the present invention shown in FIG. 10.

FIG. 16 is a diagram showing the way the calibration analog signals $IN_{CAL}$ generated from the digital correction D/A converter 4 are supplied sequentially to the sample hold capacitors $C_1, C_2, ..., C_M$ of the receiving interface 1 during the period of the foreground calibration operation of the semiconductor integrated circuit 100 according to the fourth embodiment of the present invention shown in FIG. 10.

As shown in FIG. 16, the multiphase calibration control signals $\Phi_{CAL1}, \Phi_{CAL2}, ...$ are set sequentially to the high level, and therefore, the final switches $SW_{CAL\ 1}, SW_{CAL\ 2}, ..., SW_{CAL\ M}$ of the receiving interface 1 are controlled sequentially into the ON state. Consequently, the calibration analog signal $IN_{CAL}$ generated from the digital correction D/A converter 4 is supplied sequentially to the sample hold capacitors $C_1, C_2, ..., C_M$ via the final switches $SW_{CAL\ 1}, SW_{CAL\ 2}, ..., SW_{CAL\ M}$ controlled sequentially into the ON state.

During the first high level period of the first clock signal $\phi 1$, the calibration analog signal $IN_{CAL}$ of the first sample hold capacitor $C_1$ is supplied to the input terminal of the sub A/D converter SADC of the multiplication type D/A converter MDAC$_1$ in the first stage of the single A/D converter 2. During the second high level period of the second clock signal φ2 after the first high level period of the first clock signal φ1, the sub D/A converter SDAC of the multiplication type D/A converter MDAC$_1$ in the first stage of the single A/D converter 2 is activated. Consequently, the analog residual signal generated from the multiplication type D/A converter MDAC$_1$ in the first stage is supplied to the analog input terminal of the multiplication type D/A converter MDAC$_2$ in the next stage.

During the second high level period of the first clock signal φ1, the calibration analog signal IN$_{CAL}$ of the second sample hold capacitor C$_2$ is supplied to the input terminal of the sub A/D converter SADC of the multiplication type D/A converter MDAC$_1$ in the first stage of the single A/D converter 2. During the third high level period of the second clock signal φ2 after the second high level period of the first clock signal φ1, the sub D/A converter SDAC of the multiplication type D/A converter MDAC$_1$ in the first stage of the single A/D converter 2 is activated. Consequently, the analog residual signal generated from the multiplication type D/A converter MDAC$_1$ in the first stage is supplied to the analog input terminal of the multiplication type D/A converter MDAC$_2$ in the next stage.

Fifth Embodiment

<<ΣΔ Type D/A Converter as Digital Correction D/A Converter>>

FIG. 17 is a diagram showing a configuration of a ΣΔ type D/A converter as the digital correction D/A converter 4 used in the semiconductor integrated circuit 100 as the LSI system according to the second embodiment of the present invention shown in FIG. 2, the third embodiment of the present invention shown in FIG. 7, or the fourth embodiment of the present invention shown in FIG. 10.

As shown in FIG. 17, the ΣΔ type D/A converter as the digital correction D/A converter 4 includes a ΣΔ type D/A conversion unit 41 and a switched capacitor low pass filter 42.

The ΣΔ type D/A conversion unit 41 includes, for example, a digital filter 410, an interpolator 411 of 17-bit output, adders 412, 417, delay circuits 413, 414, 416, and a quantizer 415 of 1-bit output. The adders 412, 417 and the delay circuits 413, 414 constitute a digital integrator, and therefore, the adders 412, 417, the delay circuits 413, 414, 416, and the quantizer 415 execute secondary ΣΔ D/A conversion. As to the quantized noise of the quantizer 415, the amplitude value of the feedback signal via the delay circuit 416 reduces in the high-frequency component, and therefore, the amplitude value of the output signal of the adders 412, 417 increases in the high-frequency component on the contrary. Consequently, the quantized noise of the quantizer 15 moves to the high-frequency region and the nose shaping effect is achieved and it is made possible to reduce the noise level of the quantized noise in the comparatively low frequency signal band. On the other hand, it is made possible to sufficiently suppress the comparatively high level quantized noise that moves to the high-frequency region due to the noise shaping effect.

The switched capacitor low pass filter 42 includes an input switched capacitor circuit 421, a feedback switched capacitor circuit 422, an operational amplifier 423, and a feedback capacitor 424.

As is well known, as a D/A converter, there are other D/A converters, such as a resistor ladder type, a voltage potentiometer type, and a current cell matrix type, besides the ΣΔ type D/A converter. However, compared to these D/A converters, the ΣΔ type D/A conversion unit 41 has the characteristics, such as a small area occupied by chip, small power consumption, high resolution, and high precision.

Further, the switched capacitor low pass filter 42 functions as a discrete time processing filter, and therefore, it is possible to achieve the effect that the variations in characteristics due to the variations in the passive elements are suppressed.

Furthermore, the ΣΔ type D/A converter as the digital correction D/A converter 4 according to the fifth embodiment of the present invention shown in FIG. 7 can be used as the digital correction D/A converter 4 used in the semiconductor integrated circuit 100 as the system LSI according to an eighth embodiment of the present invention shown in FIG. 20, a ninth embodiment of the present invention shown in FIG. 21, a tenth embodiment of the present invention shown in FIG. 22, or an eleventh embodiment of the present invention shown in FIG. 23, to be described later.

Sixth Embodiment

<<Configuration of System-in-Package in Sixth Embodiment>>

FIG. 18 is a diagram showing a configuration of a system-in-package according to a sixth embodiment of the present invention mounted in the on-vehicle millimeter wave radar device according to the first embodiment of the present invention shown in FIG. 1 and incorporating a microprocessor unit and an A/D converter.

As is well known, the system-in-package (SIP) is also called a multichip module (MCM) and is a hybrid semiconductor integrated circuit incorporating a plurality of semiconductor chips inside a sealing package.

The system-in-package according to the sixth embodiment of the present invention shown in FIG. 18 differs from the semiconductor integrated circuit 100 according to the second embodiment of the present invention shown in FIG. 2 in the following point.

That is, inside a package PKG of the system-in-package according to the sixth embodiment of the present invention in FIG. 18, a semiconductor chip of the semiconductor integrated circuit 100 as a system LSI and a semiconductor chip of a digital correction D/A converter 4A are incorporated. The digital correction D/A converter 4A configured in a semiconductor chip different from the semiconductor chip of the semiconductor integrated circuit 100 basically has the same D/A conversion function as that of the digital correction D/A converter 4 incorporated in the semiconductor chip of the semiconductor integrated circuit 100 according to the second embodiment of the present invention shown in FIG. 2.

In the system-in-package according to the sixth embodiment of the present invention shown in FIG. 18, as the digital correction D/A converter 4A configured in a semiconductor chip different from the semiconductor chip of the semiconductor integrated circuit 100 as the system LSI, a semiconductor chip of a general-purpose D/A converter, such as a resistor ladder type, voltage potentiometer type, and current cell matrix type, can be used. Further, it is possible for the general-purpose D/A converter to realize a comparatively high resolution.

In the preferred embodiment as shown in FIG. 18, the calibration digital signal D$_{CAL}$ generated from the correction signal generating unit 3 of the semiconductor integrated circuit 100 is supplied to the digital input terminal of the digital correction D/A converter 4A configured by the general-purpose D/A converter in the other semiconductor chip via a 1-bit serial transfer line outside the semiconductor chip. Consequently, the D/A conversion core circuit of the digital correction D/A converter 4A makes use of the design assets of the D/A conversion core circuit of the general-purpose D/A converter, however, the design of the digital input interface is modified from the multibit parallel transfer to the 1-bit serial transfer. Because of the 1-bit serial transfer line, a transfer clock signal CLK is supplied from the correction signal generating unit 3 to a clock input terminal of the digital correction D/A converter 4A via a clock transfer line outside the semiconductor chip.

Seventh Embodiment

<<Configuration of System-in-Package in Seventh Embodiment>>
FIG. 19 is a diagram showing a configuration of a system-in-package according to a seventh embodiment of the present invention mounted in the on-vehicle millimeter wave radar device according to the first embodiment of the present invention shown in FIG. 1 and incorporating a microprocessor unit and an A/D converter.

The system-in-package according to the seventh embodiment of the present invention shown in FIG. 19 differs from the system-in-package according to the sixth embodiment of the present invention shown in FIG. 18 in the following point.

That is, in the system-in-package according to the seventh embodiment of the present invention shown in FIG. 19, to the digital correction D/A converter 4A configured in the different semiconductor chip, a reference voltage generated from a reference voltage generating unit 10A configured in still another semiconductor chip is supplied. Further, also to the multiplication type D/A converters $MDAC_1$, $MDAC_2$, ..., $MDAC_N$ of the pipeline type A/D converter configured as the single A/D converter 2 of the semiconductor integrated circuit 100 shown in FIG. 19, the reference voltage generated from the reference voltage generating unit 10A configured in the different semiconductor chip is supplied.

Consequently, the reference voltage generating unit 10A configured in a semiconductor different from the semiconductor chip of the semiconductor integrated circuit 100 basically has the same function to generate the reference voltage as that of the reference voltage generating unit 10 incorporated in the semiconductor chip of the semiconductor integrated circuit 100 according to the second embodiment of the present invention shown in FIG. 2.

Eighth Embodiment

<<Configuration of System LSI in Eighth Embodiment>>
FIG. 20 is a diagram showing a configuration of the semiconductor integrated circuit 100 as a system LSI according to an eighth embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the eighth embodiment of the present invention shown in FIG. 20 differs from the semiconductor integrated circuit 100 according to the fourth embodiment of the present invention shown in FIG. 10 in the following point.

That is, to the semiconductor integrated circuit 100 in FIG. 20, an external measurement terminal T to inspect the calibration analog signal $IN_{CAL}$ generated from the digital correction D/A converter 4 from the outside of the semiconductor chip of the semiconductor integrated circuit 100 is coupled. Consequently, in the inspection step of the semiconductor chip in the mass-production step of the semiconductor integrated circuit 100, it is made possible to screen a defective semiconductor chip by measuring the voltage level of the calibration analog signal $IN_{CAL}$ generated from the digital correction D/A converter 4 from the external measurement terminal T.

Further, it is made possible to inspect a short circuit failure between both terminals of each of the sample hold capacitors $C_1, C_2, \ldots, C_M$ of the receiving interface 1 by making use of the external measurement terminal T in a different inspection step of the semiconductor chip in the mass-production step of the semiconductor integrated circuit 100. That is, in this inspection step, it is made possible to inspect a short circuit failure between both terminals of each capacitor by sequentially controlling the final switches $SW_{CAL\ 1}$, $SW_{CAL\ 2}$, ..., $SW_{CAL\ M}$ of the receiving interface 1 into the ON state.

Ninth Embodiment

<<Configuration of System LSI in Ninth Embodiment>>
FIG. 21 is a diagram showing a configuration of the semiconductor integrated circuit 100 as a system LSI according to a ninth embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the ninth embodiment of the present invention shown in FIG. 21 differs from the semiconductor integrated circuit 100 according to the second embodiment of the present invention shown in FIG. 2 in the following point.

That is, to the pipeline type A/D converter configured as the single A/D converter 2 incorporated in the semiconductor integrated circuit 100 in FIG. 21 and the digital correction D/A converter 4, the output terminal of a divider 12 is coupled and to the input terminal of the divider 12, a clock signal having a frequency $f_{CLK}$ can be supplied from the outside of the semiconductor chip.

That is, in the normal operation state where the reception signals of the receiving antennas 106, 109, 112 mounted in the on-vehicle millimeter wave radar device are A/D-converted by the single A/D converter 2, the number of divisions L to set a division ratio 1/L of the divider 12 is set to 1. Consequently, in this normal operation state, the pipeline type A/D converter configured as the single A/D converter 2 operates at the rate of the clock signal having the frequency $f_{CLK}$.

On the other hand, in the foreground calibration operation state where the calibration analog signal $IN_{CAL}$ generated from the analog output terminal of the digital correction D/A converter 4 is A/D-converted by the single A/D converter 2, the number of divisions L to set the division ratio 1/L of the divider 12 is set to a value larger than 1. Consequently, in this calibration operation state, the pipeline type A/D converter configured as the single A/D converter 2 and the digital correction D/A converter 4 operate at a frequency rate lower than the frequency $f_{CLK}$ of the clock signal.

Consequently, according to the semiconductor integrated circuit 100 in FIG. 21, the designing of the digital correction D/A converter 4 is made easy. However, the frequency rate of the pipeline type A/D converter configured as the single A/D converter 2 is different between the calibration operation state and the normal operation state, and therefore, it is necessary to design so that incomplete settling does not occur in the normal operation state at a high frequency rate.

Tenth Embodiment

<<Configuration of System LSI in Tenth Embodiment>>
FIG. 22 is a diagram showing a configuration of the semiconductor integrated circuit 100 as a system LSI according to a tenth embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the tenth embodiment of the present invention shown in FIG. 22 differs from the semiconductor integrated circuit 100 according to the ninth embodiment of the present invention shown in FIG. 21 in the following point.

That is, in the semiconductor integrated circuit 100 in FIG. 22, to the digital correction D/A converter 4, the output terminal of the divider 12 is coupled and to the pipeline type A/D converter configured as the single A/D converter 2, the clock signal having the frequency $f_{CLK}$ supplied from the outside of the semiconductor chip to the input terminal of the divider 12 is supplied.

As a result of that, in the normal operation state of the semiconductor integrated circuit 100 in FIG. 22, the pipeline type A/D converter configured as the single A/D converter 2 operates at the normal high-frequency rate.

On the other hand, in the calibration operation state of the semiconductor integrated circuit 100 in FIG. 22, the number of divisions L to set the division ratio 1/L of the divider 12 is set to a value larger than 1. Consequently, in the calibration operation state, while the digital correction D/A converter 4 operates at a low-frequency rate, the pipeline type A/D converter configured as the single A/D converter 2 operates at a high-frequency rate. Consequently, in the calibration operation state, to the pipeline type A/D converter configured as the single A/D converter 2, the calibration analog signal $IN_{CAL}$ having the same value generated from the digital correction D/A converter 4 is supplied L times successively. However, in such a calibration operation state, there is a possibility that the calibration operation of the foreground calibration digital correction unit 5 becomes unstable, and therefore, the calibration operation of the digital correction unit 5 is controlled into an intermittent operation. That is, while the calibration analog signal $IN_{CAL}$ having the same value is generated L times from the digital correction D/A converter 4, the calibration operation of the digital correction unit 5 in response to the calibration analog signal $IN_{CAL}$ is executed only once.

Eleventh Embodiment

<<Configuration of System LSI in Eleventh Embodiment>>

FIG. 23 is a diagram showing a configuration of the semiconductor integrated circuit 100 as a system LSI according to an eleventh embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the eleventh embodiment of the present invention shown in FIG. 23 differs from the semiconductor integrated circuit 100 according to the second embodiment of the present invention shown in FIG. 2 in the following point.

That is, in the semiconductor integrated circuit 100 in FIG. 23, a nonlinear compensation unit 53 to compensate for nonlinearity is added to the foreground calibration digital correction unit 5 in order to deal with the fact that the digital correction D/A converter 4 has comparatively large nonlinear characteristics as to the D/A conversion operation.

Consequently, in the digital correction unit 5 shown in FIG. 23, the digital output signal of the single A/D converter 2 is supplied to the digital output generation unit 51 and the foreground calibration unit 52. The digital output signal of the digital output generation unit 51 is supplied to the input terminal of the nonlinear compensation unit 53, the final digital output signal of the nonlinear compensation unit 53 is supplied to the radar calculation unit 6 and the foreground calibration unit 52, and the output of the foreground calibration unit 52 is supplied to the digital output generation unit 51 and the nonlinear compensation unit 53. Consequently, the digital output generation unit 51 and the nonlinear compensation unit 53 are controlled by the output of the foreground calibration unit 52 so that the calibration digital signal supplied to the foreground calibration unit 52 agrees with the final digital output signal of the nonlinear compensation unit 53.

Twelfth Embodiment

<<Configuration of System LSI in Twelfth Embodiment>>

FIG. 24 is a diagram showing a configuration of the semiconductor integrated circuit 100 as a system LSI according to a twelfth embodiment of the present invention mounted in the on-vehicle millimeter wave radar device according to the first embodiment of the present invention shown in FIG. 1 and incorporating a microprocessor unit and an A/D converter.

The semiconductor integrated circuit 100 according to the twelfth embodiment of the present invention shown in FIG. 24 differs from the semiconductor integrated circuit 100 according to the fourth embodiment of the present invention shown in FIG. 10 in the following point.

That is, in the semiconductor integrated circuit 100 shown in FIG. 24, the digital correction D/A converter 4 includes a capacitor D/A converter that utilizes the sample hold capacitors $C_1, C_2, \ldots, C_M$ inside the receiving interface 1. Further, in order to constitute the capacitor D/A converter, weights 1C, 2C, ..., $2^{M-1}C$ are added to the sample hold capacitors $C_1, C_2, \ldots, C_M$. The terminals and the other terminals of the sample hold capacitors $C_1, C_2, \ldots, C_M$ are coupled to the capacitor switch 4A and the inverted input terminal of the operational amplifier OpAmp, respectively. To the capacitor switch 4A, a multibit signal of the calibration digital signal $D_{CAL}$ of the correction signal generating unit 3 is supplied in response to a calibration timing signal $\phi_{CAL}$. Consequently, in response to the multibit signal of the calibration digital signal $D_{CAL}$, the voltage to be applied to the terminals of the sample hold capacitors $C_1, C_2, \ldots, C_M$ is determined to be a high-level voltage Vp or a low-level voltage Vn. The capacitance value of a feedback capacitor $C_F$ between the inverted input terminal and the output terminal of the operational amplifier OpAmp is set to a value of $1C+2C+\ldots, +2^{M-1}C$.

Further, in the receiving interface 1, between the input terminals $IN_1, IN_2, \ldots, IN_M$ and the terminals of the sample hold capacitors $C_1, C_2, \ldots, C_M$, the matrix switch Matrix_SW having M input terminals and M output terminals is coupled. When sampling the input signal of the first input terminal $IN_1$ in parallel with the sample hold capacitors $C_1, C_2, \ldots, C_M$, the M paths between the first terminal $IN_1$ and the M output terminals are set to the ON state. When sampling the input signal of the second input terminal $IN_2$ in parallel with the sample hold capacitors $C_1, C_2, \ldots, C_M$, the M paths between the second input terminal $IN_2$ and the M output terminals are set to the ON state. Finally, when sampling the input signal of the M-th input terminal $IN_M$ in parallel with the sample hold capacitors $C_1, C_2 \ldots, C_M$, the M paths between the M-th input terminal $IN_M$ and the M output terminals are set to the ON state.

Figure 25:
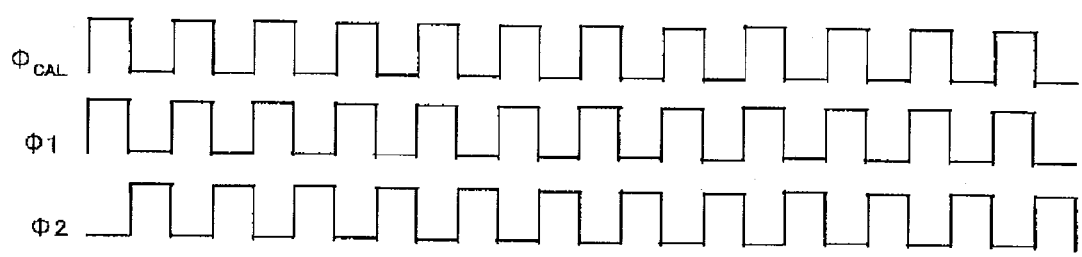
FIG. 25 is a diagram showing waveforms of a calibration timing signal $\phi_{CAL}$ and the two-phase clock signals $\phi 1$, $\phi 2$ to execute the foreground calibration operation using the digital correction D/A converter 4 inside the receiving interface 1 in the semiconductor integrated circuit 100 shown in FIG. 24.

FIG. 25 is a diagram showing waveforms of the calibration timing signal $\phi_{CAL}$ and the two-phase clock signals $\phi 1, \phi 2$ to execute the foreground calibration operation using the digital correction D/A converter 4 inside the receiving interface 1 in the semiconductor integrated circuit 100 shown in FIG. 24.

As shown in FIG. 25, during the high-level period of the calibration timing signal $\phi_{CAL}$ synchronized with the first clock signal $\phi 1$, the calibration voltage of the sample hold capacitors $C_1, C_2, \ldots, C_M$ is determined by the multibit signal of the calibration digital signal $D_{CAL}$ of the correction signal generating unit 3. Next, during the high-level period of the second clock signal $\phi 2$, the calibration voltage held by the feedback capacitor $C_F$ coupled to the operational amplifier OpAmp is A/D-converted by the pipeline type A/D converter as the single A/D converter 2.

Figure 26:
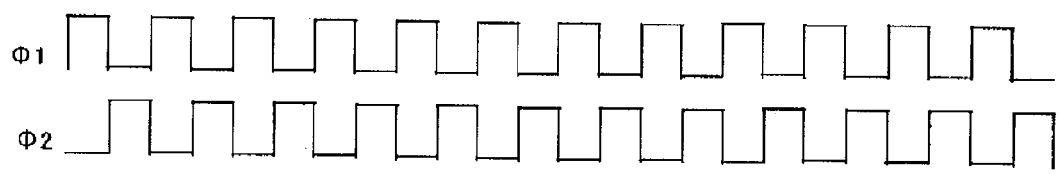
FIG. 26 is a diagram showing waveforms of the two-phase clock signals $\phi 1$, $\phi 2$ to execute the normal operation state to A/D-convert any of the reception analog signals of a plurality of input terminals $IN_1, IN_2, \ldots, IN_M$ by the single A/D converter 2 using a matrix switch Matrix_SW inside the receiving interface 1 in the semiconductor integrated circuit 100 shown in FIG. 24.

FIG. 26 is a diagram showing waveforms of the two-phase clock signals $\phi 1$, $\phi 2$ to execute the normal operation state to A/D-convert any of the reception analog signals of the input terminals $IN_1, IN_2, \ldots, IN_M$ by the single A/D converter 2 using the matrix switch Matrix_SW inside the receiving interface 1 in the semiconductor integrated circuit 100 shown in FIG. 24.

As shown in FIG. 26, during the high-level period of the first clock signal $\phi 1$, the reception analog signal supplied from any of the input terminals $IN_1, IN_2, \ldots, IN_M$ of the receiving interface 1 is sampled between both terminals of the sample hold capacitors $C_1, C_2, \ldots, C_M$ via the matrix switch Matrix_SW.

As shown in FIG. 26, during the high-level period of the second clock signal $\phi 2$, the reception analog signal held by the feedback capacitor $C_F$ coupled to the operational amplifier OpAmp is A/D-converted by the pipeline type A/D converter as the single A/D converter 2.

Thirteenth Embodiment

<<Calibration Operation and Normal Operation in Thirteenth Embodiment>>

Figure 27:
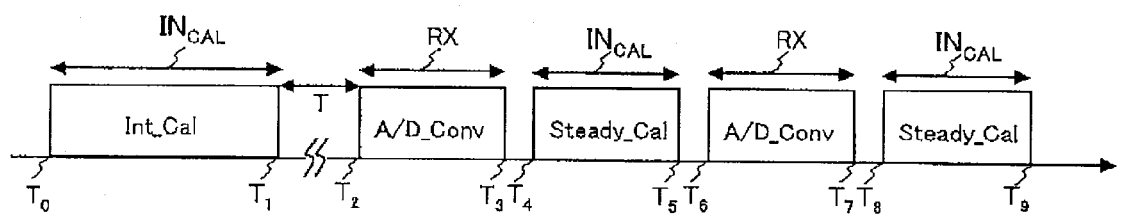
FIG. 27 is a diagram showing the calibration operation state and the normal operation state of the system LSI or system-in-package according to the second embodiment of the present invention in FIG. 2, the third embodiment of the present invention in FIG. 7, the fourth embodiment of the present invention in FIG. 10, the sixth embodiment of the present invention in FIG. 18, the seventh embodiment of the present invention in FIG. 19, the eighth embodiment of the present invention in FIG. 20, the ninth embodiment of the present invention in FIG. 21, the tenth embodiment of the present invention in FIG. 22, or the eleventh embodiment of the present invention in FIG. 23.

FIG. 27 is a diagram showing the calibration operation state and the normal operation state of the system LSI or system-in-package according to the second embodiment of the present invention in FIG. 2, the third embodiment of the present invention in FIG. 7, the fourth embodiment of the present invention in FIG. 10, the sixth embodiment of the present invention in FIG. 18, the seventh embodiment of the present invention in FIG. 19, the eighth embodiment of the present invention in FIG. 20, the ninth embodiment of the present invention in FIG. 21, the tenth embodiment of the present invention in FIG. 22, or the eleventh embodiment of the present invention in FIG. 23.

At time $T_0$ in FIG. 27, the engine of an automobile in which the on-vehicle millimeter wave radar device shown in FIG. 1 is mounted is started and the supply of the power source voltage to the system LSI or system-in-package mounted in the on-vehicle millimeter wave radar device is started. In this power ON state, during the first period from time $T_0$ to time $T_1$, an initial correction operation Int_Cal of the foreground calibration operation is executed using the foreground digital correction type A/D converter including the single A/D converter 2, the correction signal generating unit 3, the digital correction D/A converter 4 (or 4A), the digital correction unit 5, and the receiving interface 1.

That is, in the initial correction operation Int_Cal, in response to the calibration digital signal of the correction signal generating unit 3, the calibration analog signal $IN_{CAL}$ generated from the analog output terminal of the digital correction D/A converter 4 (4A) is supplied to the analog input terminal of the single A/D converter 2 via the multiplexer included in the receiving interface 1. Consequently, the digital correction unit 5 executes the first calibration operation using the digital output signal from the digital output terminal of the single A/D converter 2.

When the initial correction operation Int_Cal from time $T_0$ to time $T_1$ in FIG. 27 is completed and time T elapses, during the first period from time $T_2$ to time $T_3$, a first normal operation state A/D_Conv is started and the reception signals from the reception mixers of the RF receiving units 105, 108, 111 mounted in the on-vehicle millimeter wave radar device in FIG. 1 are supplied to the input terminals $IN_1, IN_2, \ldots, IN_M$. Consequently, the single A/D converter 2 executes the A/D conversion of a reception signal RX and the radar calculation unit 6 starts digital calculation of the A/D-converted digital signal.

When the first normal operation state A/D_Conv from time $T_2$ to time $T_3$ in FIG. 27 is completed and during the next period from time $T_4$ to time $T_5$, a first steady correction operation Steady_Cal is executed. In the steady correction operation Steady_Cal also, in response to the calibration digital signal of the correction signal generating unit 3, the calibration analog signal $IN_{CAL}$ generated from the analog output terminal of the digital correction D/A converter 4(4A) is supplied to the analog input terminal of the single A/D converter 2 via the multiplexer included in the receiving interface 1. As a result of that, the digital correction unit 5 executes the calibration operation using the digital output signal from the digital output terminal of the single A/D converter 2.

When the first steady correction operation Steady_Cal from time $T_4$ to time $T_5$ in FIG. 27 is completed, during the next period from time $T_6$ to time $T_7$, the second normal operation state A/D_Conv is started and the single A/D converter 2 executes A/D conversion of the reception signal RX.

When the second normal operation A/D_Conv during the period from time $T_6$ to time $T_7$ in FIG. 27 is completed, during the next period from time $T_8$ to time $T_9$, the second steady correction operation Steady_Cal is executed and the single A/D converter 2 executes A/D conversion of the calibration analog signal $IN_{CAL}$.

Fourteenth Embodiment

<<Calibration Operation and Normal Operation in Fourteenth Embodiment>>

Figure 28:
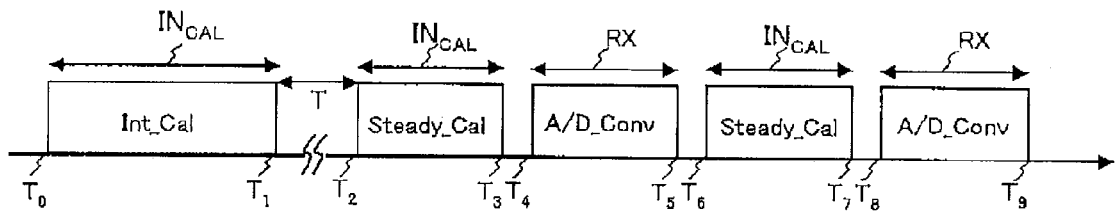
FIG. 28 is a diagram showing the calibration operation state and the normal operation state of the system LSI or system-in-package according to the second embodiment of the present invention in FIG. 2, the third embodiment of the present invention in FIG. 7, the fourth embodiment of the present invention in FIG. 10, the sixth embodiment of the present invention in FIG. 18, the seventh embodiment of the present invention in FIG. 19, the eighth embodiment of the present invention in FIG. 20, the ninth embodiment of the present invention in FIG. 21, the tenth embodiment of the present invention in FIG. 22, or the eleventh embodiment of the present invention in FIG. 23.

FIG. 28 is a diagram showing the calibration operation state and the normal operation state of the system LSI or system-in-package according to the second embodiment of the present invention in FIG. 2, the third embodiment of the present invention in FIG. 7, the fourth embodiment of the present invention in FIG. 10, the sixth embodiment of the present invention in FIG. 18, the seventh embodiment of the present invention in FIG. 19, the eighth embodiment of the present invention in FIG. 20, the ninth embodiment of the present invention in FIG. 21, the tenth embodiment of the present invention in FIG. 22, or the eleventh embodiment of the present invention in FIG. 23.

The calibration operation and the normal operation according to a fourteenth embodiment of the present invention shown in FIG. 28 differ from the calibration operation and the normal operation according to the thirteenth embodiment of the present invention shown in FIG. 27 in the following point.

That is, in the calibration operation and the normal operation according to the fourteenth embodiment of the present invention shown in FIG. 28, after the initial correction operation Int_Cal is completed, the first steady correction operation Steady_Cal is executed before the first normal operation state A/D_Conv shown in FIG. 27 and further, before the second normal operation state A/D_Conv, the second steady correction operation Steady_Cal is executed.

Consequently, according to the fourteenth embodiment of the present invention shown in FIG. 28, it is made possible to reduce the deterioration in precision of the digital output signal of the A/D converter 2 resulting from the variations in the characteristics of the system LSI or system-in-package during the period of elapse of time T after the initial correction operation Int_Cal from $T_0$ to time $T_1$ in the thirteenth embodiment of the present invention shown in FIG. 27 is completed.

Fifteenth Embodiment

<<Calibration Operation and Normal Operation in Fifteenth Embodiment>>

FIG. 29 is a diagram showing the calibration operation state and the normal operation state of the system LSI according to the fourth embodiment of the present invention in FIG. 10 or the eighth embodiment of the present invention in FIG. 20.

The calibration operation and the normal operation according to a fifteenth embodiment of the present invention shown in FIG. 29 differ from the calibration operation and the normal operation according to the fourteenth embodiment of the present invention shown in FIG. 28 in the following point.

That is, according to the fifteenth embodiment of the present invention shown in FIG. 29, it is made possible to sequentially execute a plurality of calibration operations between the initial correction operation Int_Cal and the second steady correction operation Steady_Cal as to the sample hold capacitors $C_1, C_2, \ldots, C_M$ coupled to a plurality of channels of the input terminals $IN_1, IN_2, \ldots, IN_M$ of the multiplexer. As a result of that, it is made possible to reduce the deterioration in precision of the sequential A/D-converted digital output signals of the A/D converter 2 of the channels executed sequentially even if there is a capacitance error of the sample hold capacitors $C_1, C_2, \ldots, C_M$.

Sixteenth Embodiment

<<Calibration Operation and Normal Operation in Sixteenth Embodiment>>

FIG. 30 is a diagram showing the calibration operation state and the normal operation state of the system LSI according to the fourth embodiment of the present invention in FIG. 10 or the eighth embodiment of the present invention in FIG. 20.

The calibration operation and the normal operation according to a sixteenth embodiment of the present invention shown in FIG. 30 differ from the calibration operation and the normal operation according to the fifteenth embodiment of the present invention shown in FIG. 29 in the following point.

That is, according to the sixteenth embodiment of the present invention shown in FIG. 30, it is made possible to sequentially execute a plurality of calibration operations as to a plurality of channels $1, 2, \ldots, M$ of the multiplexer during each period of the initial correction operation Int_Cal or the second steady correction operation Steady_Cal. As a result of that, it is made possible to improve the precision of the sequential A/D-converted digital output signals of the A/D converter 2.

Seventeenth Embodiment

<<Calibration Operation and Normal Operation in Seventeenth Embodiment>>

Figure 31:
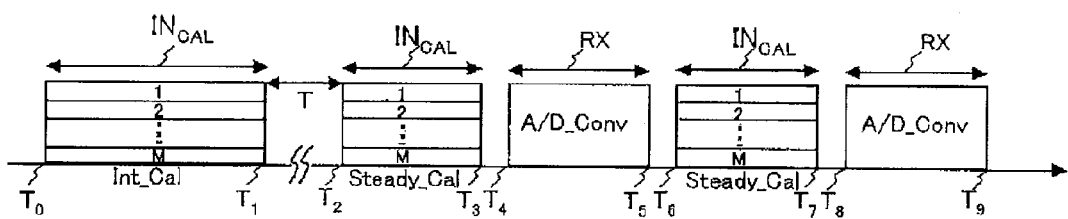
FIG. 31 is a diagram showing the calibration operation state and the normal operation state of the system LSI according to the fourth embodiment of the present invention in FIG. 10 or the eighth embodiment of the present invention in FIG. 20.

FIG. 31 is a diagram showing the calibration operation state and the normal operation state of the system LSI according to the fourth embodiment of the present invention in FIG. 10 or the eighth embodiment of the present invention in FIG. 20.

The calibration operation and the normal operation according to a seventeenth embodiment of the present invention shown in FIG. 31 differ from the calibration operation and the normal operation according to the fifteenth embodiment of the present invention shown in FIG. 29 in the following point.

That is, according to the seventeenth embodiment of the present invention shown in FIG. 31, it is made possible to execute a plurality of calibration operations in parallel as to the channels $1, 2, \ldots, M$ of the multiplexer during each period of the initial correction operation Int_Cal or the second steady correction operation Steady_Cal.

The invention made by the inventors of the present invention is explained specifically as above based on the various embodiments, however, it is needless to say that the present invention is not limited to those and there can be various modifications in the scope not deviating from its gist.

For example, the automobile in which the on-vehicle millimeter wave radar device that uses the system LSI or system-in-package according to the various embodiments of the present invention is not limited to an automobile that uses an internal combustion engine in which the petroleum fuel, such as gasoline and light oil, is burned as a drive source. It is needless to say that the on-vehicle millimeter wave radar device that uses the system LSI or system-in-package according to the various embodiments of the present invention can also be mounted in an electric automobile that uses an electric motor that is driven by a battery as a drive source or a hybrid automobile that uses an internal combustion engine and an electric motor.

What is claimed is:

1. A semiconductor integrated circuit that can be mounted in a millimeter wave radar device, the semiconductor integrated circuit comprising:
a single A/D converter to A/D-convert a plurality of reception signals generated from a plurality of reception mixers of the millimeter wave radar device, where the single A/D converter includes a foreground digital correction type A/D converter;
a receiving interface including a multiplexer having a plurality of input terminals to which the reception signals can be supplied as a multi-input terminal; and
a microprocessor unit that responds to an output digital signal of the A/D converter,
wherein a correction signal generating unit, a digital correction D/A converter, and a digital correction unit constitute the foreground digital correction type A/D converter,
wherein the foreground digital correction type A/D converter sequentially A/D-converts the reception signals output from an output terminal of the multiplexer of the receiving interface,
wherein the single A/D converter further includes a pipeline type A/D converter having a plurality of converters that are cascade-coupled,
wherein during a calibration operation of the foreground digital correction type A/D converter, a calibration digital signal generated from the correction signal generating unit is supplied to an input terminal of the digital correction D/A converter, wherein a calibration analog signal generated from an output terminal of the digital correction D/A converter is supplied to an input terminal of the single A/D converter via the output terminal of the multiplexer, wherein during the calibration operation, a digital calibration output signal generated from an output terminal of the single A/D converter and the calibration digital signal generated from the correction signal generating unit are supplied to the digital correction unit, and thereby, a foreground digital correction output signal is generated from an output terminal of the digital correction unit, wherein during a normal operation of the foreground digital correction type A/D converter, the reception signals output from the output terminal of the multiplexer are supplied sequentially to the input terminal of the single A/D converter, wherein during the normal operation, a digital normal output signal generated sequentially from the output terminal of the single A/D converter is supplied to the digital correction unit, and thereby, a normal digital correction output signal is generated from the output terminal of the digital correction unit, wherein the receiving interface further includes a plurality of capacitor elements coupled, respectively, between the multi-input terminal and the output terminal of the multiplexer, wherein the receiving interface further includes a plurality of calibration switches coupled, respectively, between the capacitor elements and the output terminal of the digital correction D/A converter, wherein during the normal operation of the foreground digital correction type A/D converter, the reception signals generated from the reception mixers are sampled substantially at the same time by the capacitor elements, wherein during the calibration operation of the foreground digital correction type A/D converter, the calibration switches are controlled sequentially into an ON state, wherein the calibration analog signal generated from the output terminal of the digital correction D/A converter is supplied sequentially to the capacitor elements, and wherein during the calibration operation, the digital correction unit sequentially executes a digital calibration operation for a plurality of digital calibration output signals generated sequentially from the output terminal of the single A/D converter in response to the calibration analog signal supplied sequentially to the capacitor elements.

2. The semiconductor integrated circuit according to claim 1, further comprising a divider capable of executing a division operation of an operation clock signal, wherein during the normal operation of the foreground digital correction type A/D converter, a number of divisions of the divider is set to a first value and a normal operation output clock signal of the divider, the number of divisions of which is set to the first value, is supplied to the single A/D converter and the digital correction D/A converter, and wherein during the calibration operation of the foreground digital correction type A/D converter, the number of divisions of the divider is set to a value larger than the first value and a calibration operation output clock signal of the divider, the number of divisions of which is set to the larger value, is supplied to the single A/D converter and the digital correction D/A converter.

3. The semiconductor integrated circuit according to claim 1, further comprising a divider capable of executing a division operation of an operation clock signal, wherein during the calibration operation of the foreground digital correction type A/D converter, a number of divisions of the divider is set to a value larger than a first value used during the normal operation and a calibration operation output clock signal of the divider, the number of divisions of which is set to the larger value, and the operation clock signal are supplied to the digital correction D/A converter and the single A/D converter, respectively.

4. A semiconductor integrated circuit that can be mounted in a millimeter wave radar device, the semiconductor integrated circuit comprising:

a single A/D converter to A/D-convert a plurality of reception signals generated from a plurality of reception mixers of the millimeter wave radar device, where the single A/D converter includes a foreground digital correction type A/D converter;

a receiving interface including a multiplexer having a plurality of input terminals to which the reception signals can be supplied as a multi-input terminal; and a microprocessor unit that responds to an output digital signal of the A/D converter, wherein a correction signal generating unit, a digital correction D/A converter, and a digital correction unit constitute the foreground digital correction type A/D converter, wherein the foreground digital correction type A/D converter sequentially A/D-converts the reception signals output from an output terminal of the multiplexer of the receiving interface, wherein the single A/D converter further includes a pipeline type A/D converter having a plurality of converters that are cascade-coupled, wherein during a calibration operation of the foreground digital correction type A/D converter, a calibration digital signal generated from the correction signal generating unit is supplied to an input terminal of the digital correction D/A converter, wherein a calibration analog signal generated from an output terminal of the digital correction D/A converter is supplied to an input terminal of the single A/D converter via the output terminal of the multiplexer, wherein during the calibration operation, a digital calibration output signal generated from an output terminal of the single A/D converter and the calibration digital signal generated from the correction signal generating unit are supplied to the digital correction unit, and thereby, a foreground digital correction output signal is generated from an output terminal of the digital correction unit, wherein during a normal operation of the foreground digital correction type A/D converter, the reception signals output from the output terminal of the multiplexer are supplied sequentially to the input terminal of the single A/D converter, wherein during the normal operation, a digital normal output signal generated sequentially from the output terminal of the single A/D converter is supplied to the digital correction unit, and thereby, a normal digital correction output signal is generated from the output terminal of the digital correction unit, and wherein the digital correction D/A converter is configured by cascade-coupling a ΣΔ type D/A conversion unit and a switched capacitor low pass filter.

5. A semiconductor integrated circuit that can be mounted in a millimeter wave radar device, the semiconductor integrated circuit comprising:

a single A/D converter to A/D-convert a plurality of reception signals generated from a plurality of reception mixers of the millimeter wave radar device, where the single A/D converter includes a foreground digital correction type A/D converter;

a receiving interface including a multiplexer having a plurality of input terminals to which the reception signals can be supplied as a multi-input terminal; and a microprocessor unit that responds to an output digital signal of the A/D converter, wherein a correction signal generating unit, a digital correction D/A converter, and a digital correction unit constitute the foreground digital correction type A/D converter, wherein the foreground digital correction type A/D converter sequentially A/D-converts the reception signals output from an output terminal of the multiplexer of the receiving interface, wherein the single A/D converter further includes a pipeline type A/D converter having a plurality of converters that are cascade-coupled, wherein during a calibration operation of the foreground digital correction type A/D converter, a calibration digital signal generated from the correction signal generating unit is supplied to an input terminal of the digital correction D/A converter, wherein a calibration analog signal generated from an output terminal of the digital correction D/A converter is supplied to an input terminal of the single A/D converter via the output terminal of the multiplexer, wherein during the calibration operation, a digital calibration output signal generated from an output terminal of the single A/D converter and the calibration digital signal generated from the correction signal generating unit are supplied to the digital correction unit, and thereby, a foreground digital correction output signal is generated from an output terminal of the digital correction unit, wherein during a normal operation of the foreground digital correction type A/D converter, the reception signals output from the output terminal of the multiplexer are supplied sequentially to the input terminal of the single A/D converter, wherein during the normal operation, a digital normal output signal generated sequentially from the output terminal of the single A/D converter is supplied to the digital correction unit, and thereby, a normal digital correction output signal is generated from the output terminal of the digital correction unit, wherein the receiving interface further includes a plurality of capacitor elements coupled, respectively, between the multi-input terminal and the output terminal of the multiplexer, wherein the receiving interface further includes a plurality of calibration switches coupled, respectively, between the capacitor elements and the output terminal of the digital correction D/A converter, wherein during the normal operation of the foreground digital correction type A/D converter, the reception signals generated from the reception mixers are sampled substantially at the same time by the capacitor elements, wherein during the calibration operation of the foreground digital correction type A/D converter, the calibration switches are controlled sequentially into an ON state, wherein the calibration analog signal generated from the output terminal of the digital correction D/A converter is supplied sequentially to the capacitor elements, and wherein during the calibration operation, the digital correction unit sequentially executes a digital calibration operation for a plurality of digital calibration output signals generated sequentially from the output terminal of the single A/D converter in response to the calibration analog signal supplied sequentially to the capacitor elements, and wherein the output terminal of the digital correction D/A converter and the calibration switches are electrically coupled to an external terminal of the semiconductor integrated circuit.

6. A semiconductor integrated circuit that can be mounted in a millimeter wave radar device, the semiconductor integrated circuit comprising:

a single A/D converter to A/D-convert a plurality of reception signals generated from a plurality of reception mixers of the millimeter wave radar device, where the single A/D converter includes a foreground digital correction type A/D converter;

a receiving interface including a multiplexer having a plurality of input terminals to which the reception signals can be supplied as a multi-input terminal; and a microprocessor unit that responds to an output digital signal of the A/D converter, wherein a correction signal generating unit, a digital correction D/A converter, and a digital correction unit constitute the foreground digital correction type A/D converter, wherein the foreground digital correction type A/D converter sequentially A/D-converts the reception signals output from an output terminal of the multiplexer of the receiving interface, wherein the single A/D converter further includes a pipeline type A/D converter having a plurality of converters that are cascade-coupled, wherein during a calibration operation of the foreground digital correction type A/D converter, a calibration digital signal generated from the correction signal generating unit is supplied to an input terminal of the digital correction D/A converter, wherein a calibration analog signal generated from an output terminal of the digital correction D/A converter is supplied to an input terminal of the single A/D converter via the output terminal of the multiplexer, wherein during the calibration operation, a digital calibration output signal generated from an output terminal of the single A/D converter and the calibration digital signal generated from the correction signal generating unit are supplied to the digital correction unit, and thereby, a foreground digital correction output signal is generated from an output terminal of the digital correction unit, wherein during a normal operation of the foreground digital correction type A/D converter, the reception signals output from the output terminal of the multiplexer are supplied sequentially to the input terminal of the single A/D converter, wherein during the normal operation, a digital normal output signal generated sequentially from the output terminal of the single A/D converter is supplied to the digital correction unit, and thereby, a normal digital correction output signal is generated from the output terminal of the digital correction unit, wherein in the receiving interface, a plurality of input terminals of a matrix switch is coupled to the input terminals and a plurality of capacitor elements, to the capacitance values of which, predetermined weights are added, is coupled to a plurality of output terminals of the matrix switch, and thereby, a capacitor D/A converter is configured by the capacitor elements to which the predetermined weights are added, and wherein the digital correction D/A converter is configured by the capacitor D/A converter including the capacitor elements.

7. A method of operating a semiconductor integrated circuit that can be mounted in a millimeter wave radar device, the semiconductor integrated circuit including:

a single A/D converter to A/D-convert a plurality of reception signals generated from a plurality of reception mixers of the millimeter wave radar device, where the single A/D converter includes a foreground digital correction type A/D converter;

a receiving interface including a multiplexer having a plurality of input terminals to which the reception signals can be supplied as a multi-input terminal; and a microprocessor unit that responds to an output digital signal of the A/D converter, wherein a correction signal generating unit, a digital correction D/A converter, and a digital correction unit constitute the foreground digital correction type A/D converter, wherein the foreground digital correction type A/D converter sequentially A/D-converts the reception signals output from an output terminal of the multiplexer of the receiving interface, wherein the single A/D converter further includes a pipeline type A/D converter having a plurality of converters that are cascade-coupled, wherein during a calibration operation of the foreground digital correction type A/D converter, a calibration digital signal generated from the correction signal generating unit is supplied to an input terminal of the digital correction D/A converter, wherein a calibration analog signal generated from an output terminal of the digital correction D/A converter is supplied to an input terminal of the single A/D converter via the output terminal of the multiplexer, wherein during the calibration operation, a digital calibration output signal generated from an output terminal of the single A/D converter and the calibration digital signal generated from the correction signal generating unit are supplied to the digital correction unit, and thereby, a foreground digital correction output signal is generated from an output terminal of the digital correction unit, wherein during a normal operation of the foreground digital correction type A/D converter, the reception signals output from the output terminal of the multiplexer are supplied sequentially to the input terminal of the single A/D converter, wherein during the normal operation, a digital normal output signal generated sequentially from the output terminal of the single A/D converter is supplied to the digital correction unit, and thereby, a normal digital correction output signal is generated from the output terminal of the digital correction unit, wherein the receiving interface further includes a plurality of capacitor elements coupled, respectively, between the multi-input terminal and the output terminal of the multiplexer, wherein the receiving interface further includes a plurality of calibration switches coupled, respectively, between the capacitor elements and the output terminal of the digital correction D/A converter, wherein during the normal operation of the foreground digital correction type A/D converter, the reception signals generated from the reception mixers are sampled substantially at the same time by the capacitor elements, wherein during the calibration operation of the foreground digital correction type A/D converter, the calibration switches are controlled sequentially into an ON state, wherein the calibration analog signal generated from the output terminal of the digital correction D/A converter is supplied sequentially to the capacitor elements, and wherein during the calibration operation, the digital correction unit sequentially executes a digital calibration operation for a plurality of digital calibration output signals generated sequentially from the output terminal of the single A/D converter in response to the calibration analog signal supplied sequentially to the capacitor elements, the method comprising:

when turning on the power source of the semiconductor integrated circuit, prior to the execution of a first normal operation of the foreground digital correction type A/D converter, a first calibration operation of the foreground digital correction type A/D converter is executed.

8. The method of operating a semiconductor integrated circuit according to claim 7, wherein between the execution of the first normal operation after turning on the power source of the semiconductor integrated circuit and the execution of the second normal operation, the calibration operation is executed in an intermediate manner.

9. The method of operating a semiconductor integrated circuit according to claim 7, wherein after the execution of the first calibration operation, prior to the execution of the first normal operation, the second calibration operation is executed.

10. The method of operating a semiconductor integrated circuit according to claim 9, wherein during the calibration operation, the digital calibration operation is executed sequentially for the capacitor elements of the multiplexer of the receiving interface.

* * * * *